US008871561B2

(12) United States Patent
Takahashi et al.

(10) Patent No.: US 8,871,561 B2
(45) Date of Patent: Oct. 28, 2014

(54) VARIABLE RESISTANCE NONVOLATILE STORAGE DEVICE AND METHOD FOR MANUFACTURING THE SAME

(75) Inventors: Ichirou Takahashi, Kyoto (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 167 days.

(21) Appl. No.: 13/805,233

(22) PCT Filed: Jan. 30, 2012

(86) PCT No.: PCT/JP2012/000585
§ 371 (c)(1),
(2), (4) Date: Dec. 18, 2012

(87) PCT Pub. No.: WO2012/105225
PCT Pub. Date: Aug. 9, 2012

(65) Prior Publication Data
US 2013/0095634 A1    Apr. 18, 2013

(30) Foreign Application Priority Data

Feb. 1, 2011    (JP) ................ 2011-020073

(51) Int. Cl.
| H01L 21/00 | (2006.01) |
| H01L 21/20 | (2006.01) |
| H01L 45/00 | (2006.01) |
| H01L 27/24 | (2006.01) |

(52) U.S. Cl.
CPC ............ *H01L 45/1683* (2013.01); *H01L 45/04* (2013.01); *H01L 27/2463* (2013.01); *H01L 45/1625* (2013.01); *H01L 45/146* (2013.01); *H01L 27/2436* (2013.01)
USPC 438/95; 438/382; 257/E21.004; 257/E29.176; 257/E21.495

(58) Field of Classification Search
CPC . H01L 45/1683; H01L 45/04; H01L 27/2436; H01L 45/1625; H01L 27/2463; H01L 45/146; H01L 27/11582
USPC ............ 438/95, 382; 257/E21.004, E29.176, 257/E21.495
See application file for complete search history.

(56) References Cited

U.S. PATENT DOCUMENTS

| 6,753,561 B1 | 6/2004 | Rinerson et al. |
| 7,602,042 B2 | 10/2009 | Ahn et al. |

(Continued)

FOREIGN PATENT DOCUMENTS

| JP | 60-242615 | 12/1985 |
| JP | 01-256152 | 10/1989 |

(Continued)

OTHER PUBLICATIONS

International Search Report issued Apr. 10, 2012 in International (PCT) Application No. PCT/JP2012/000585.

*Primary Examiner* — Michelle Mandala
(74) *Attorney, Agent, or Firm* — Wenderoth, Lind & Ponack, LLP.

(57) ABSTRACT

Provided is a method for manufacturing a variable resistance nonvolatile storage device, which prevents electrical conduction between lower electrodes and upper electrodes of variable resistance elements in the memory cell holes. The method includes: forming lower copper lines; forming a third interlayer insulating layer; forming memory cell holes in the third interlayer insulating layer, an opening diameter of upper portions of the memory cell holes being smaller than bottom portions; forming a metal electrode layer on the bottom of each memory cell holes by sputtering; embedding and forming a variable resistance layer in each memory cell hole; and forming upper copper lines connected to the variable resistance layer embedded and formed in each memory cell hole.

8 Claims, 20 Drawing Sheets

(56) References Cited

U.S. PATENT DOCUMENTS

| | | |
|---|---|---|
| 7,935,953 B2 | 5/2011 | Ahn et al. |
| 8,153,488 B2 | 4/2012 | Nishitani et al. |
| 8,188,833 B2 | 5/2012 | Tsuji |
| 8,222,626 B2 | 7/2012 | Sato et al. |
| 2006/0098472 A1 | 5/2006 | Ahn et al. |
| 2008/0121865 A1 | 5/2008 | Ahn et al. |
| 2009/0052225 A1 | 2/2009 | Morimoto |
| 2010/0202186 A1 | 8/2010 | Sato et al. |
| 2010/0243980 A1 | 9/2010 | Fukumizu |
| 2010/0248431 A1 | 9/2010 | Nishitani et al. |
| 2011/0037045 A1 | 2/2011 | Fukumizu et al. |
| 2011/0074539 A1 | 3/2011 | Tsuji |
| 2011/0147941 A1 | 6/2011 | Muta et al. |
| 2011/0220861 A1 | 9/2011 | Himeno et al. |

FOREIGN PATENT DOCUMENTS

| | | |
|---|---|---|
| JP | 2005-136097 | 5/2005 |
| JP | 2006-140489 | 6/2006 |
| JP | 2006-203098 | 8/2006 |
| JP | 2007-220768 | 8/2007 |
| JP | 2008-235427 | 10/2008 |
| JP | 2009-218259 | 9/2009 |
| JP | 2010-080518 | 4/2010 |
| JP | 2010-123922 | 6/2010 |
| JP | 2010-135527 | 6/2010 |
| JP | 2010-186872 | 8/2010 |
| JP | 2010-226027 | 10/2010 |
| JP | 2010-232214 | 10/2010 |
| JP | 2010-232228 | 10/2010 |
| WO | 2010/050094 | 5/2010 |
| WO | 2010/119677 | 10/2010 |

FIG. 8

|  |  | Hole diameter R(nmφ) | Hole opening diameter ratio r/R | Substrate bias (W) | Thickness of metal electrode layer on inner wall (nm) |
|---|---|---|---|---|---|
| I | Example 1 | 100 | 0.57 | 400 | 0 |
|  | Example 2 | 100 | 0.72 | 400 | 0 |
|  | Comparative Example 1 | 100 | 1.00 | 400 | 6.95 |
| II | Example 3 | 100 | 0.57 | 200 | 0 |
|  | Example 4 | 100 | 0.72 | 200 | 0 |
|  | Comparative Example 2 | 100 | 1.00 | 200 | 12.8 |
| III | Example 5 | 100 | 0.57 | 0 | 0 |
|  | Example 6 | 100 | 0.72 | 0 | 0 |
|  | Comparative Example 3 | 100 | 1.00 | 0 | 9.3 |
| IV | Example 7 | 120 | 0.67 | 400 | 0 |
|  | Example 8 | 120 | 0.82 | 400 | 0 |
|  | Comparative Example 4 | 120 | 1.00 | 400 | 8.05 |
| V | Example 9 | 120 | 0.67 | 200 | 0 |
|  | Example 10 | 120 | 0.82 | 200 | 0 |
|  | Comparative Example 5 | 120 | 1.00 | 200 | 11.6 |
| VI | Example 11 | 120 | 0.82 | 0 | 3.5 |
|  | Comparative Example 6 | 120 | 1.00 | 0 | 11.6 |
| VII | Example 12 | 140 | 0.70 | 400 | 0 |
|  | Example 13 | 140 | 0.89 | 400 | 3.5 |
|  | Comparative Example 7 | 140 | 1.00 | 400 | 11.5 |
| VIII | Example 14 | 140 | 0.89 | 200 | 4.7 |
|  | Comparative Example 8 | 140 | 1.00 | 200 | 14 |
| IX | Example 15 | 140 | 0.89 | 0 | 5.8 |
|  | Comparative Example 9 | 140 | 1.00 | 0 | 15.1 |

VARIABLE RESISTANCE NONVOLATILE STORAGE DEVICE AND METHOD FOR MANUFACTURING THE SAME

TECHNICAL FIELD

The present invention relates to a cross-point variable resistance nonvolatile storage device which includes a variable resistance layer, and in particular to a variable resistance nonvolatile storage device having a structure suitable for miniaturization, and a method for manufacturing the same.

BACKGROUND ART

In recent years, along with the progress of digital technology for electronic devices, large capacity, nonvolatile semiconductor storage devices are being actively developed for the purpose of storing data such as music, images, and information. For example, nonvolatile semiconductor storage devices in which ferroelectrics are used as capacitative elements are already used in many fields. Furthermore, in contrast to such nonvolatile semiconductor storage devices in which ferroelectric capacitors are used, variable resistance nonvolatile storage devices in which a material whose resistance value changes due to an application of an electric pulse, and maintains that state (hereinafter, also referred to as ReRAM) are gaining attention, since it is easy to achieve consistency with an ordinary semiconductor process.

As a variable resistance layer, a nickel oxide film (NiO), a vanadium oxide film ($V_2O_5$), a zinc oxide film (ZnO), a niobium oxide film ($Nb_2O_5$), a titanium oxide film ($TiO_2$), a tungsten oxide film ($WO_3$), a cobalt oxide film (CoO), or the like is used. It is known that such a transition metal oxide film exhibits a specific resistance value when a voltage or current greater than or equal to a threshold value is applied, and holds that resistance value until a voltage or current is newly applied, and furthermore has a feature of being able to be produced using the known DRAM process as it is.

Patent Literature (PTL) 1 discloses a configuration of a ReRAM having a cross-point structure, in which memory plugs are formed at crossing portions between electric conduction array lines in the X and Y directions. The memory plugs each include a variable resistance element and a diode element having a metal-insulator-metal (MIM) structure. The variable resistance element has a three-layered structure which includes a lower electrode layer, a composite metal oxide, and an upper electrode layer, and the diode element has a three-layered structure which includes a metal layer, an insulating layer, and a metal layer. An electrode layer which connects the variable resistance element and the diode element is further provided, and thus the memory plug has a stack structure which includes seven layers in total.

Further, PTL 2 discloses a cross-point type ReRAM which has, between a bit line and a word line, a resistance structure and a diode structure.

PTL 3 also discloses a cross-point ReRAM which has, between a bit line and a word line, a variable resistance element which includes a lower electrode, a variable resistor, and an upper electrode, and a nonlinear element connected to the variable resistance element in series.

CITATION LIST

Patent Literature

[PTL 1] U.S. Pat. No. 6,753,561
[PTL 2] Japanese Unexamined Patent Application Publication No. 2006-140489
[PTL 3] Japanese Unexamined Patent Application Publication No. 2006-203098

SUMMARY OF INVENTION

Technical Problem

The memory cell structures described in PTL 1, PTL 2, and PTL 3 above, for instance, have a variable resistance element and a diode element formed at each crossing portion of bit lines and word lines. In order to form such a memory cell, a stack structure having three or more layers is necessary. For example, when a bit line is shared as a lower electrode of a variable resistance element, a word line is shared as an upper electrode of a diode element, and the upper electrode of the variable resistance element and the lower electrode of the diode element are shared to form an intermediate electrode layer, a memory cell has a stack structure which includes a variable resistance layer included in a variable resistance element, an intermediate electrode layer, and a diode layer included in a diode element (an insulating layer or a semiconductor layer).

Such a memory cell can be manufactured in accordance with the following manufacturing method, for example. Specifically, as illustrated in (a) of FIG. 23, a variable resistance layer 2, an intermediate electrode layer 3, and a diode layer 4 are formed on and above a previously processed bit line 1 in this state order, thereby forming a stack film. Thereafter, the stack film is processed into a pillar shape using lithography and dry etching, as illustrated in (b) of FIG. 23. Although only one pillar is illustrated in (b) of FIG. 23, a large number of pillars corresponding to memory cells are formed adjacent to one another, practically. After that, as illustrated in (c) of FIG. 23, the stack film processed into a pillar shape is embedded in an interlayer insulating layer 8, and finally, a word line 5 connected to the diode layer 4 is formed on the interlayer insulating layer 8.

Here, a stack body which includes the bit line 1, the variable resistance layer 2, and the intermediate electrode layer 3 functions as a variable resistance element 6, and a stack body which includes the intermediate electrode layer 3, the diode layer 4 (here, a semiconductor layer), and the word line 5 functions as a metal-semiconductor-metal (MSM) diode element 7. The variable resistance element 6 and the diode element 7 form one memory cell.

If a memory cell is to be miniaturized without changing the thicknesses of the variable resistance element 6 and the diode element 7, or in other words, only of the lateral size is to be reduced without changing a design rule for the thickness direction of the layers of the memory cell, an aspect ratio (the height of the memory cell/the width of the memory cell) is increased.

If a pillar-shaped memory cell having a high aspect ratio is to be formed using dry etching in accordance with the method described above, a mask pattern layer is ablated during etching, and thus the shape of the memory cell is easily tapered. Although the durability of the mask pattern layer can be improved by making the mask pattern layer thick, this causes another problem that the precision of a fine pattern is decreased due to the thick mask pattern layer.

In this manner, the method of forming a pillar-shaped memory cell having a high aspect ratio by dry etching is not suitable for miniaturization, and thus it is difficult to achieve a large-capacity variable resistance nonvolatile storage device by using such a method. It should be noted that in this specification, the variable resistance nonvolatile storage device means a nonvolatile storage device which includes plural variable resistance elements.

The vapor pressure of, for example, copper (Cu) which is a material often used for lines and electrodes is low, whereas both the vapor pressure and reactivity of noble metal materials such as platinum (Pt) and palladium (Pd), for example, are low. Such features of the materials also make fine pattern formation by dry etching difficult.

In view of this, as effective approach to miniaturization, a conceivable method is for previously forming an interlayer insulating layer, and thereafter providing a memory cell hole in the interlayer insulating layer, and forming a variable resistance element and a diode element in the memory cell hole provided in the interlayer insulating layer. With this method, a resistance change material, an electrode material, and a semiconducting material are embedded in a memory cell hole, thereby forming a memory cell. In this manner, in a variable resistance nonvolatile storage element in which a variable resistance element is embedded and formed in a memory cell hole, an upper electrode and a lower electrode of the variable resistance element need to be formed so as not to be short-circuited. Specifically, along with the miniaturization of a memory cell hole, it is important to form a metal electrode to serve as a lower electrode of a variable resistance element only on the bottom of the memory cell hole, or on the bottom and the inner wall portion in the vicinity of the bottom. However, a manufacturing method is not established yet which is for reliably forming a metal electrode to serve as a lower electrode only on the bottom of the memory cell hole or on the bottom and the inner wall portion in the vicinity of the bottom so as to prevent electrical short circuit with the upper electrode of the variable resistance element.

In view of this, the present invention is conceived to solve the above conventional problems, and an object thereof is to provide a method for manufacturing a variable resistance nonvolatile storage device, which allows a metal electrode which is to serve as a lower electrode to be reliably formed only on the bottom of a memory cell hole or on the bottom and the inner wall portion in the vicinity of the bottom so as to prevent electrical conduction between the lower electrode and an upper electrode of a variable resistance element, and to provide a variable resistance nonvolatile storage device having a structure obtained by such a manufacturing method.

Solution to Problem

In order to solve the above problems, a method for manufacturing a variable resistance nonvolatile storage device according to an aspect of the present invention includes: (a) forming plural lower lines above a substrate; (b) forming an interlayer insulating layer on the plural lower lines and above the substrate; (c) forming, in the interlayer insulating layer, plural memory cell holes penetrating to surfaces of the plural lower lines, an opening diameter of upper portions of the plural memory cell holes being smaller than an opening diameter of bottom portions; (d) forming a metal electrode layer at least on a bottom of each of the plural memory cell holes by sputtering; (e) embedding and forming a variable resistance layer in each of the plural memory cell holes, the variable resistance layer being connected to the metal electrode layer; and (f) forming, on the interlayer insulating layer and the variable resistance layer, plural upper lines connected to the variable resistance layer embedded and formed in each of the plural memory cell holes.

In order to solve the above problems, a variable resistance nonvolatile storage device according to an aspect of the present invention includes: a substrate; plural lower lines formed above the substrate; an interlayer insulating layer formed on the plural lower lines and above the substrate, and having formed therein plural memory cell holes penetrating to surfaces of the plural lower lines, an opening diameter of upper portions of the plural memory cell holes being smaller than an opening diameter of bottom portions; a metal electrode layer formed on a bottom of each of the plural memory cell holes; a variable resistance layer embedded and formed in each of the plural memory cell holes, the variable resistance layer being connected to the metal electrode layer; and plural upper lines formed on the interlayer insulating layer and the variable resistance layer, and connected to the variable resistance layer embedded and formed in each of the plural memory cell holes.

Advantageous Effects of Invention

According to the manufacturing method and the variable resistance nonvolatile storage device according to the present invention, a metal electrode layer which is to serve as a lower electrode is reliably formed only on the bottom of a memory cell hole or on the bottom and the inner wall portion in the vicinity of the bottom so as to prevent electrical short circuit with an upper electrode of a variable resistance element. This achieves a variable resistance nonvolatile storage device having a structure suitable for miniaturization and large capacity, and having a variable resistance element embedded and formed in a memory cell hole.

BRIEF DESCRIPTION OF DRAWINGS

Part (a) of FIG. 1 is a plan view illustrating a structure of a variable resistance nonvolatile storage device according to Embodiment 1 of the present invention, and (b) of FIG. 1 is a cross-sectional view taken along line 1A-1A in (a) of FIG. 1 and showing the variable resistance nonvolatile storage device viewed in the arrow direction.

Figure 3:
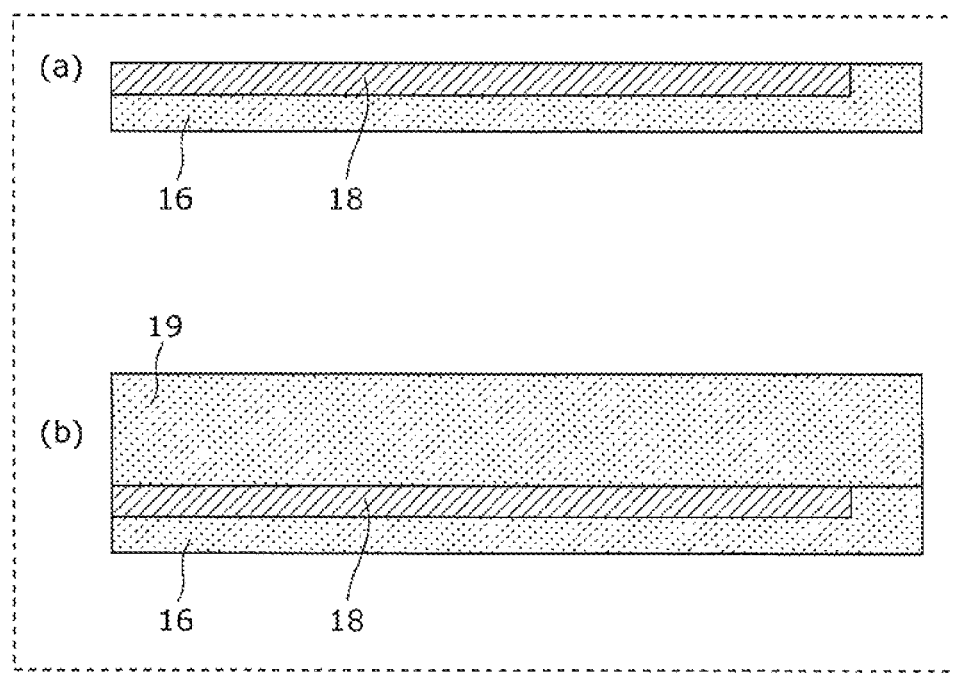

Parts (a) and (b) of FIG. 3 illustrate steps of forming an interlayer insulating layer on a lower line embedded and formed in an interlayer insulating layer, in a method for manufacturing the variable resistance nonvolatile storage device according to Embodiment 1 of the present invention.

Figure 4:
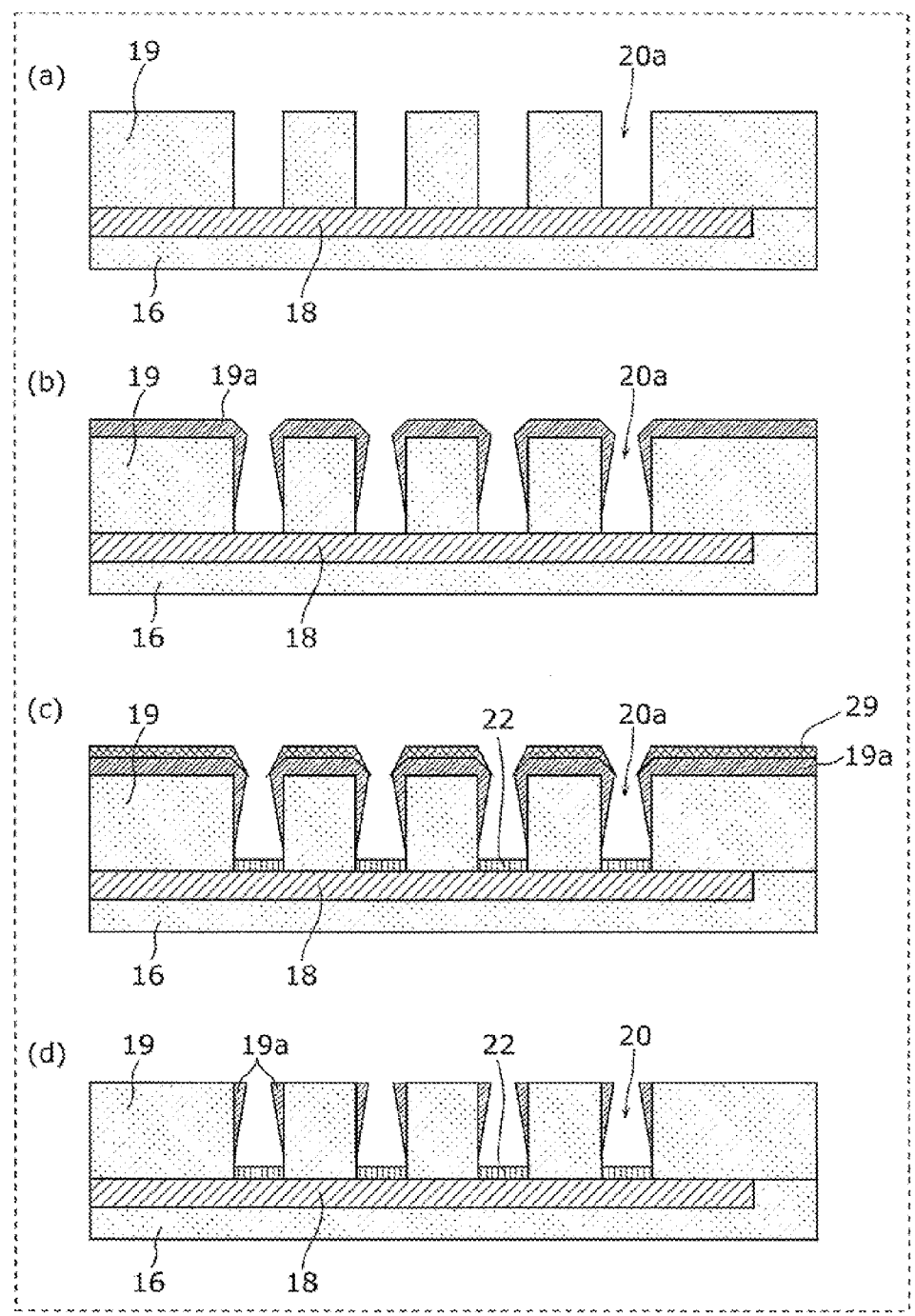

Parts (a) to (d) of FIG. 4 illustrate steps of forming memory cell holes each having an eaves-like shaped inner wall portion in the vicinity of an opening of the memory cell hole, and embedding and forming metal electrodes in the memory cell holes, in the method for manufacturing the variable resistance nonvolatile storage device according to Embodiment 1 of the present invention.

Figure 5:
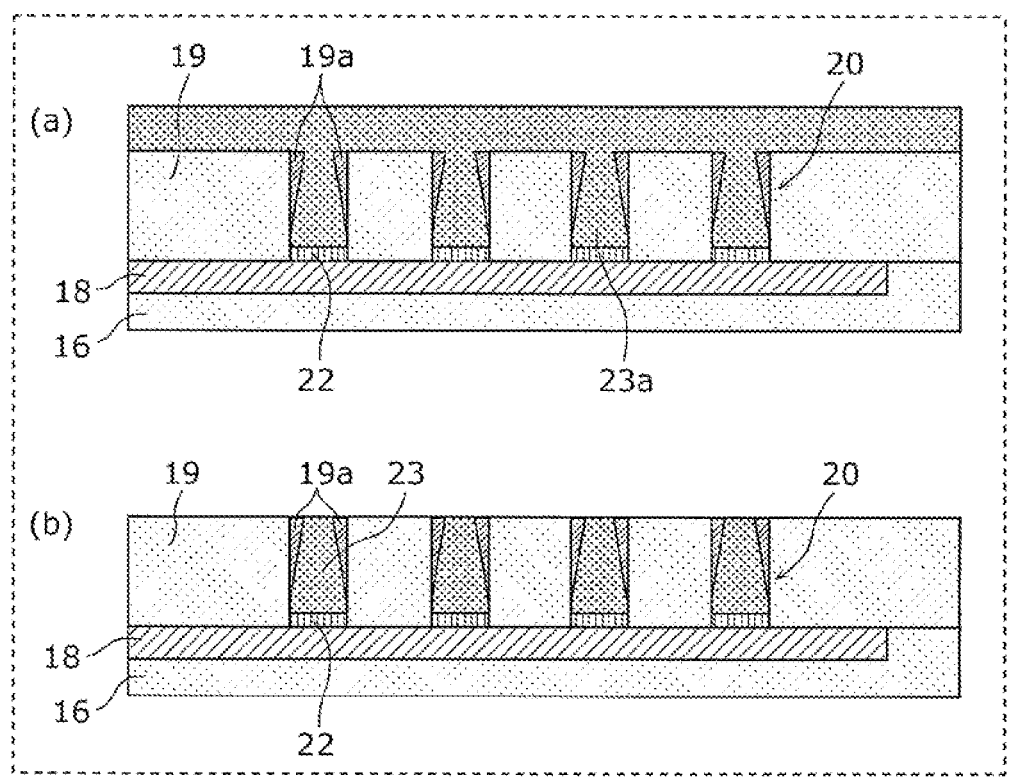

Parts (a) and (b) of FIG. 5 illustrate steps of embedding and forming a variable resistance layer in each of the memory cell holes, in the method for manufacturing the variable resistance nonvolatile storage device according to Embodiment 1 of the present invention.

Figure 6:
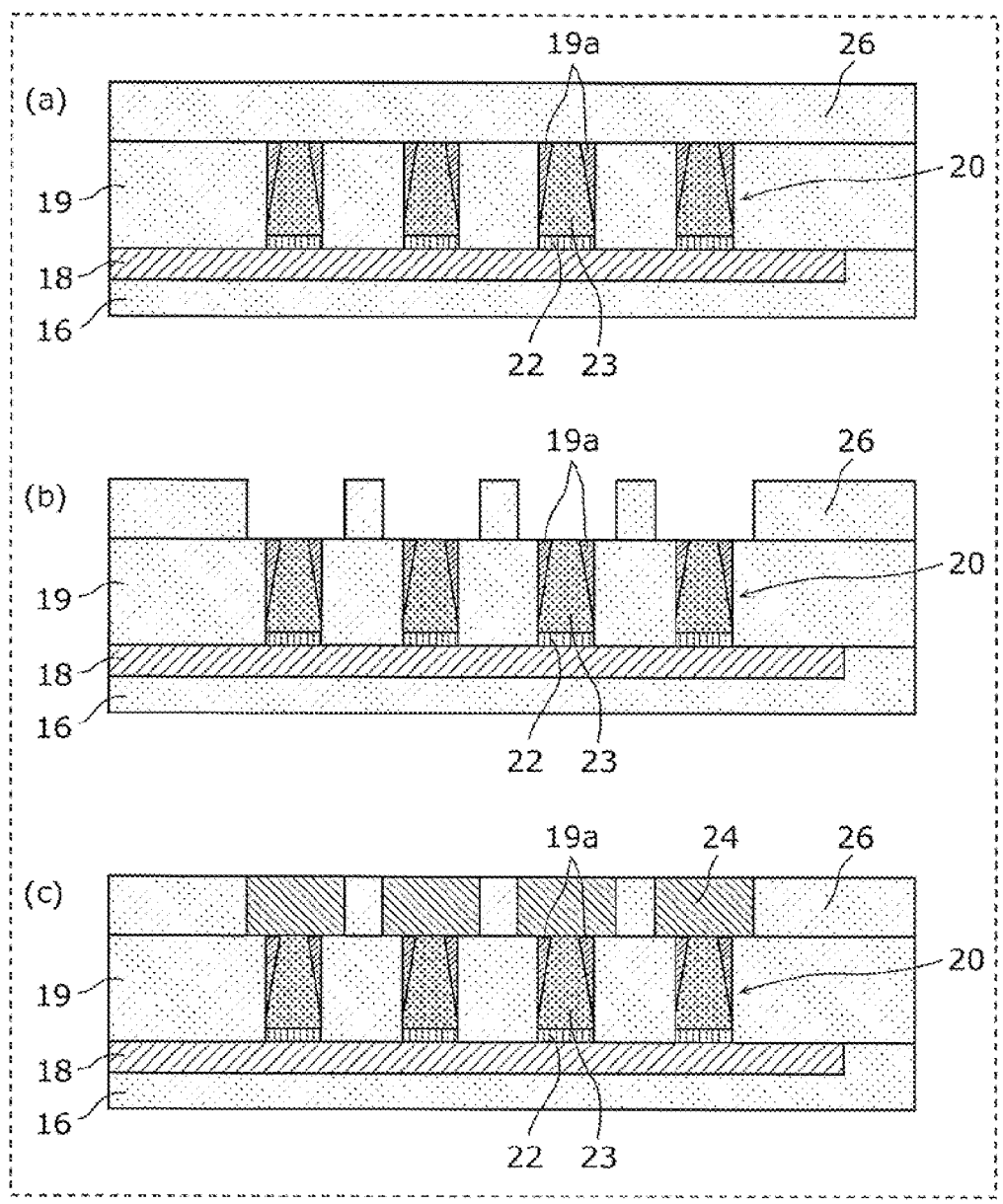

Parts (a) to (c) of FIG. 6 illustrate steps of forming upper lines connected to the variable resistance layer, in the method for manufacturing the variable resistance nonvolatile storage device according to Embodiment 1 of the present invention.

Figure 7:
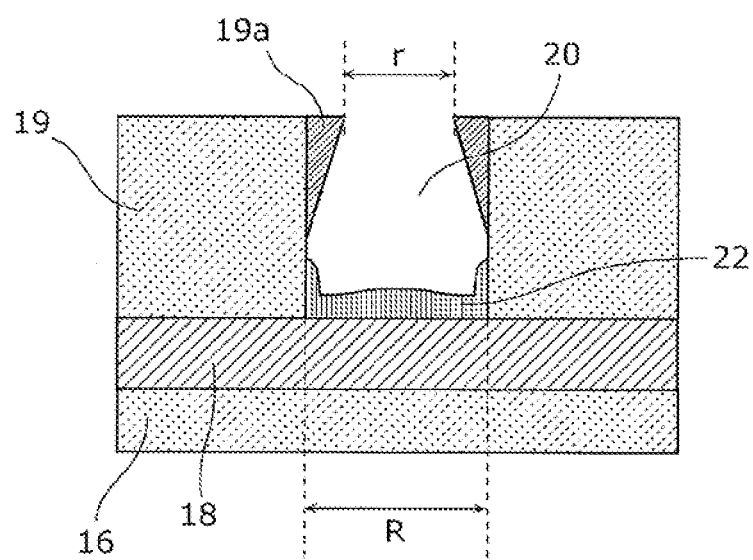

FIG. 7 illustrates an example of a cross section of a memory cell after process (D) of forming the metal electrode layer, in the method for manufacturing the variable resistance nonvolatile storage device according to Embodiment 1 of the present invention.

FIG. 8 illustrates experimental data obtained from Examples 1 to 15 and Comparative Examples 1 to 9 of the variable resistance nonvolatile storage device according to Embodiment 1 of the present invention.

Figure 9:
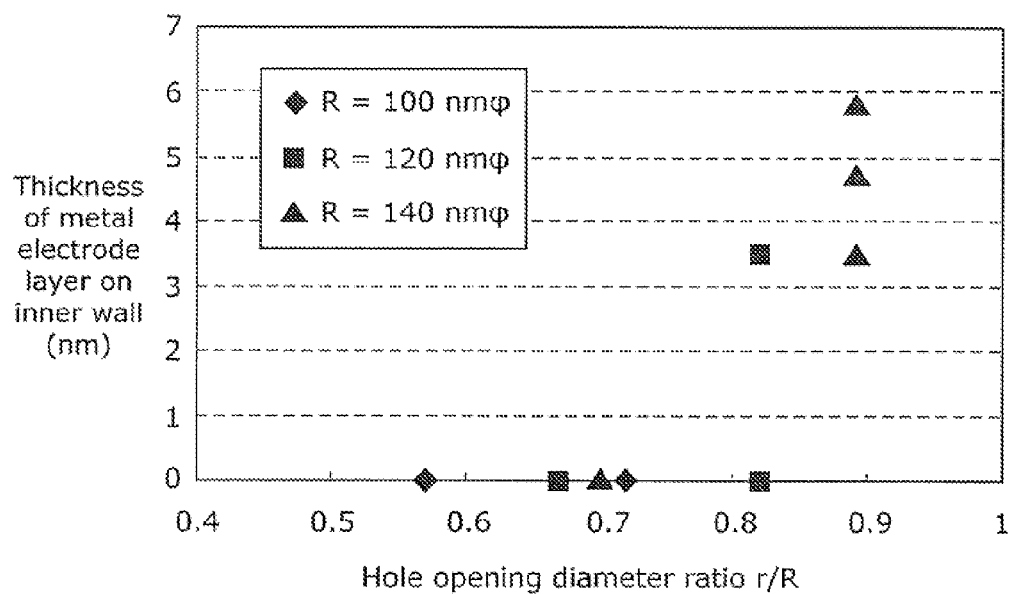

FIG. 9 is a graph obtained by plotting a relationship between a hole opening diameter ratio r/R and the thickness of the metal electrode layer on the inner wall in Examples 1 to 15 illustrated in FIG. 8.

Figure 10:
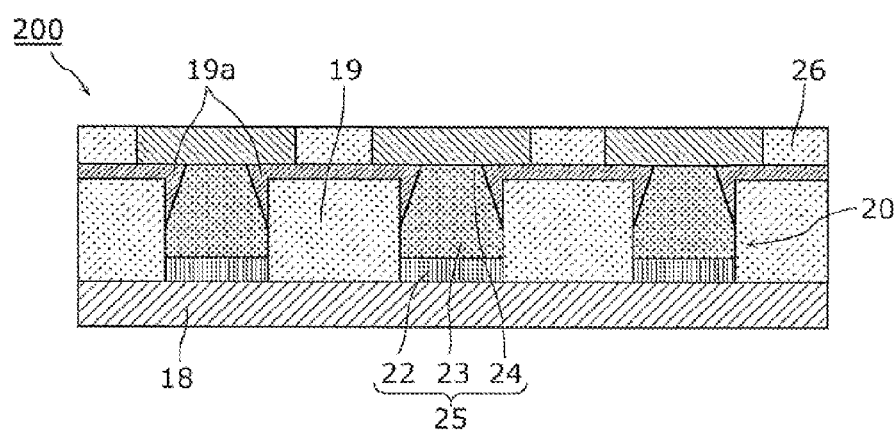

FIG. 10 is a cross-sectional view of an important part for illustrating a structure of variable resistance elements of a variable resistance nonvolatile storage device according to Embodiment 2 of the present invention.

Figure 11:
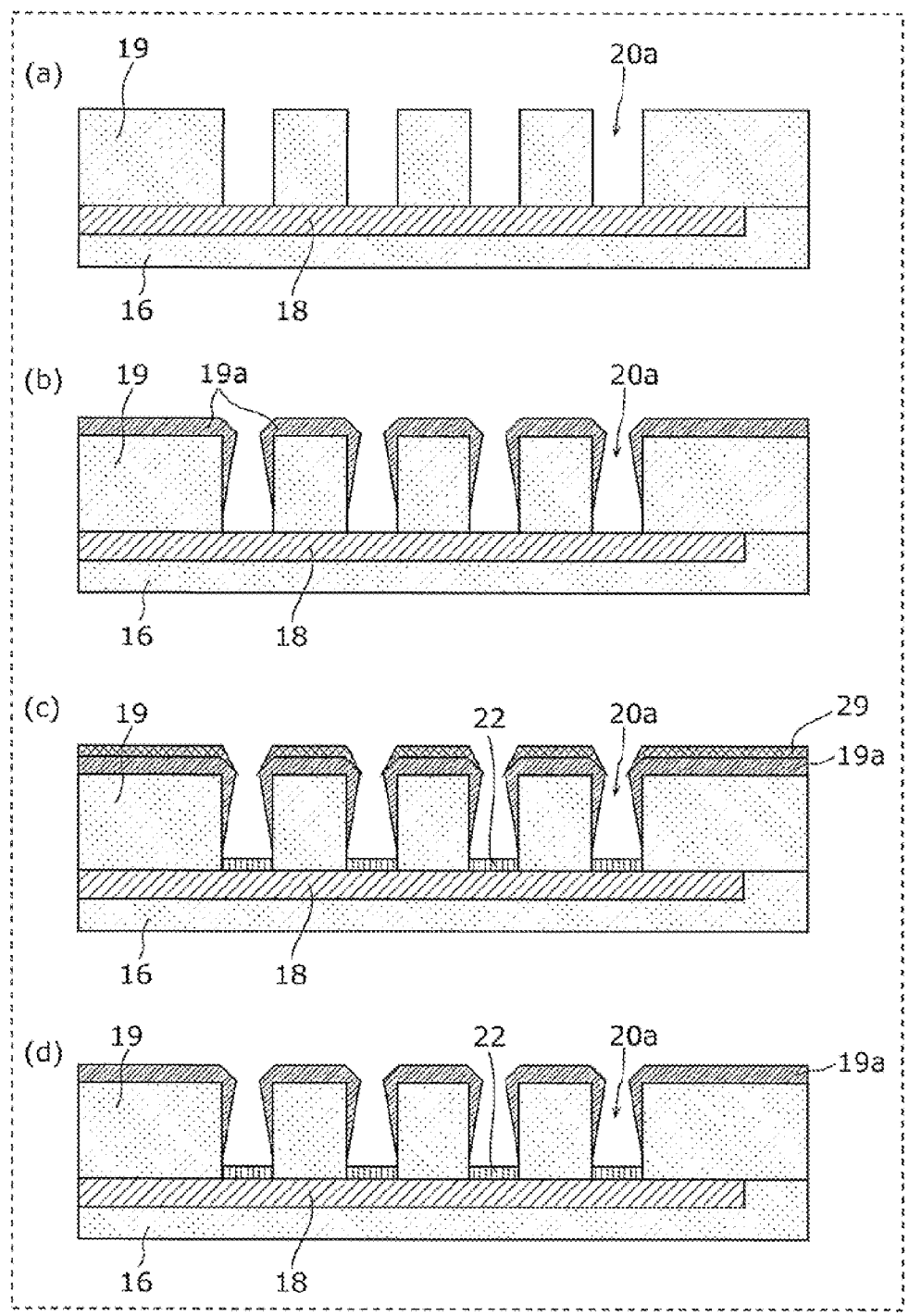

Parts (a) to (d) of FIG. 11 illustrate steps of forming memory cell holes each having an eaves-like shaped inner wall portion in the vicinity of an opening of the memory cell hole, and embedding and forming a metal electrode in each of the memory cell holes, in a method for manufacturing the variable resistance nonvolatile storage device according to Embodiment 2 of the present invention.

Figure 12:
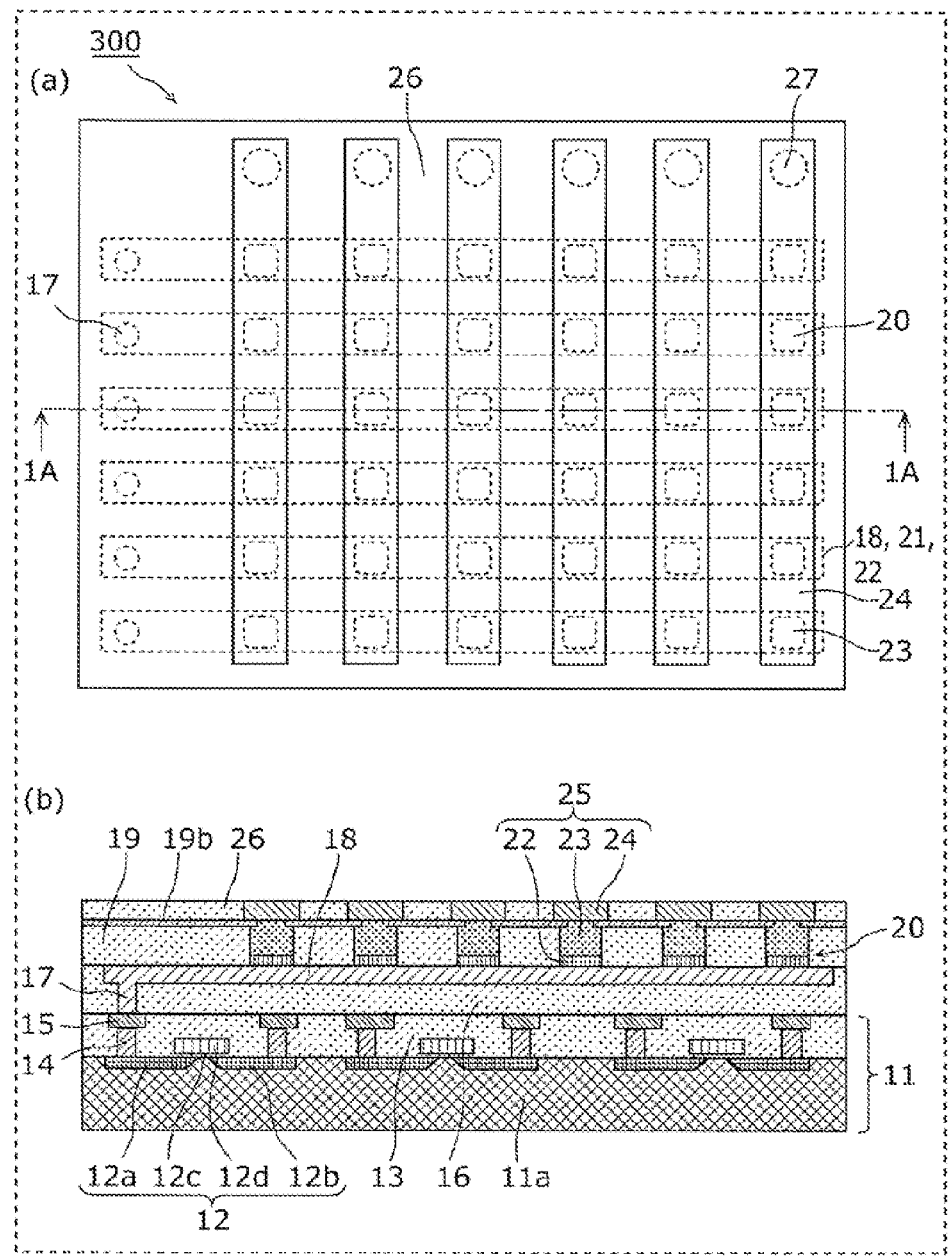

Part (a) of FIG. 12 is a plan view illustrating a structure of a variable resistance nonvolatile storage device according to Embodiment 3 of the present invention, and (b) of FIG. 12 is a cross-sectional view taken along line 1A-1A in (a) of FIG. 12 and showing the variable resistance nonvolatile storage device viewed in the arrow direction.

Figure 13:
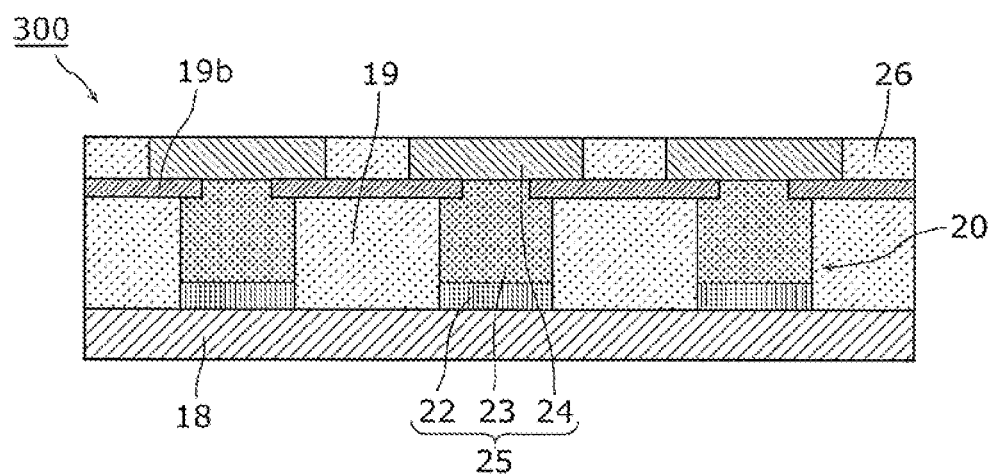

FIG. 13 is a cross-sectional view of an important part for illustrating a structure of variable resistance elements of the variable resistance nonvolatile storage device according to Embodiment 3 of the present invention.

Figure 14:
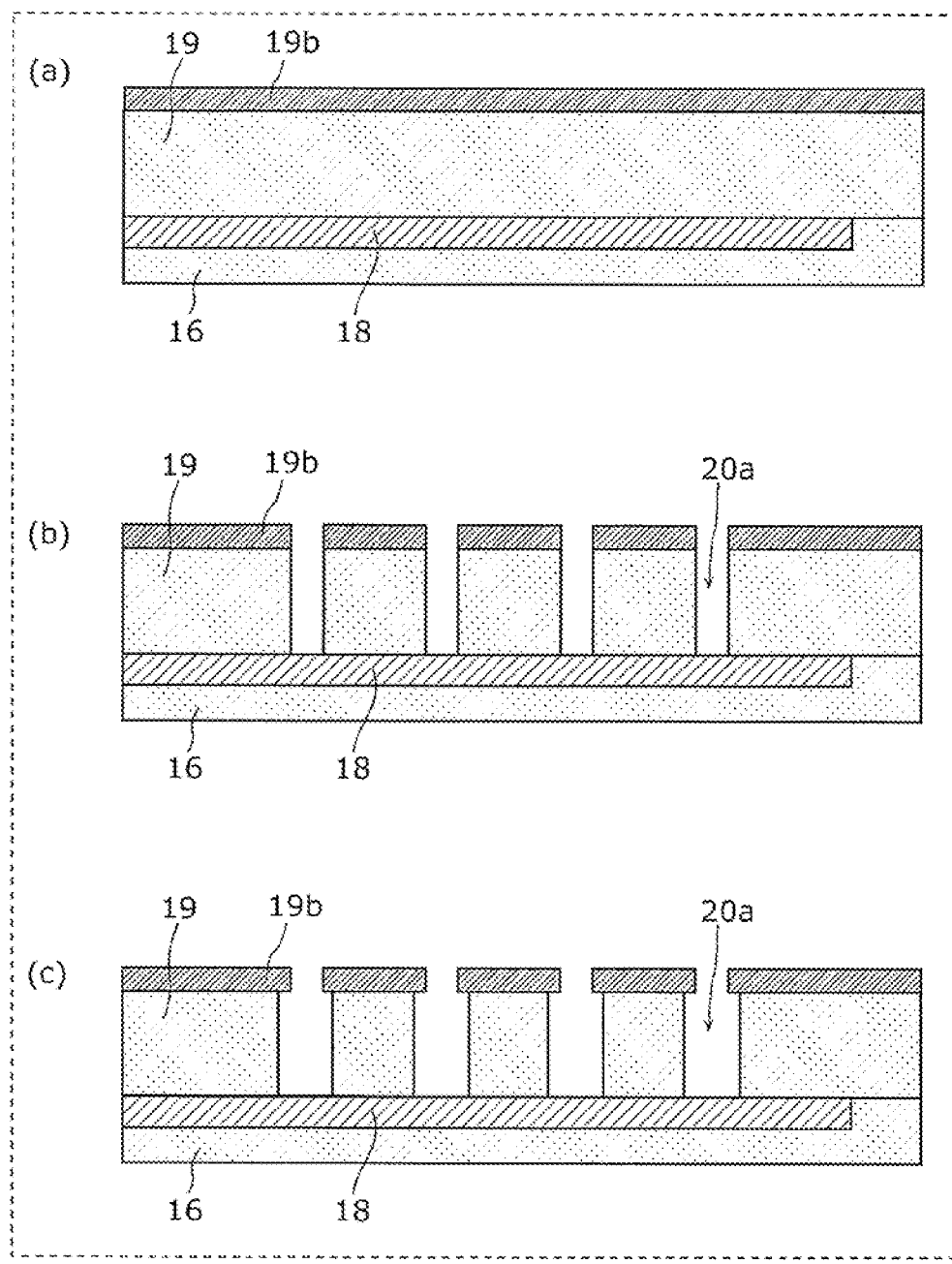

Parts (a) to (c) of FIG. 14 illustrate steps of forming an interlayer insulating layer on a lower line embedded and formed in an interlayer insulating layer, in a method for manufacturing the variable resistance nonvolatile storage device according to Embodiment 3 of the present invention.

Figure 15:
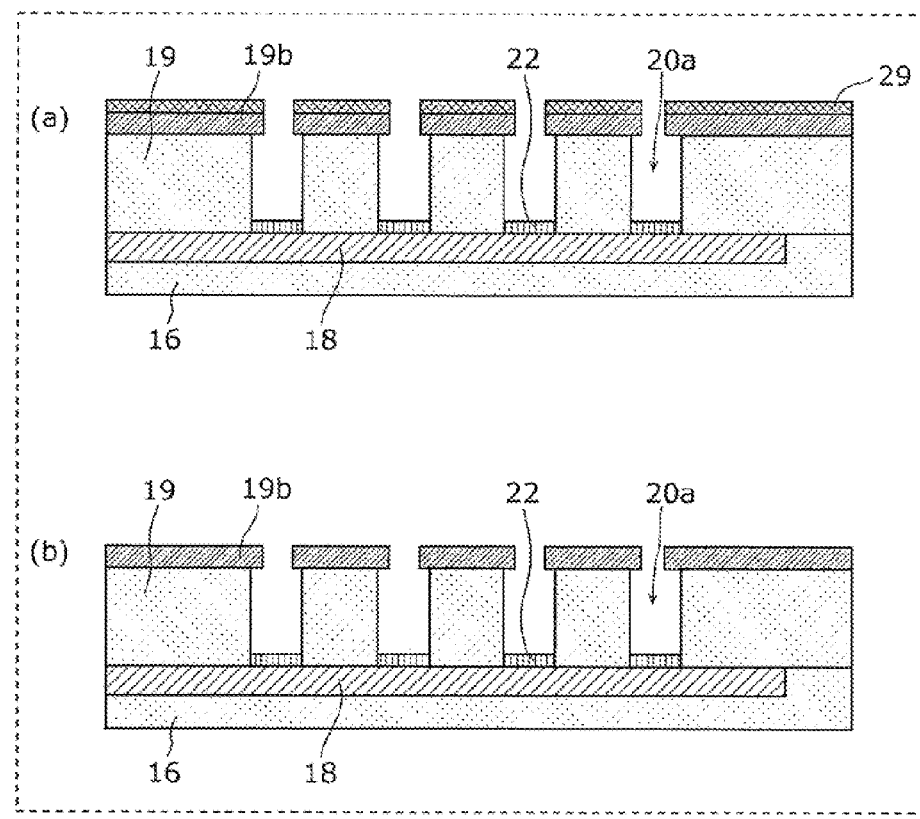

Parts (a) and (b) of FIG. 15 illustrate steps of forming memory cell holes each having an eaves-like shaped inner wall portion in the vicinity of an opening of the memory cell hole, in the method for manufacturing the variable resistance nonvolatile storage device according to Embodiment 3 of the present invention.

Figure 16:
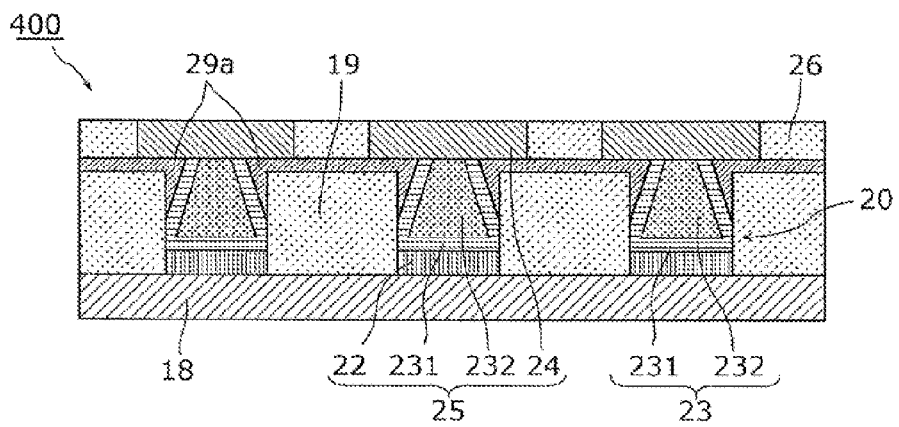

FIG. 16 is a cross-sectional view of an important part for illustrating a structure of variable resistance elements of a variable resistance nonvolatile storage device according to Embodiment 4 of the present invention.

Figure 17:
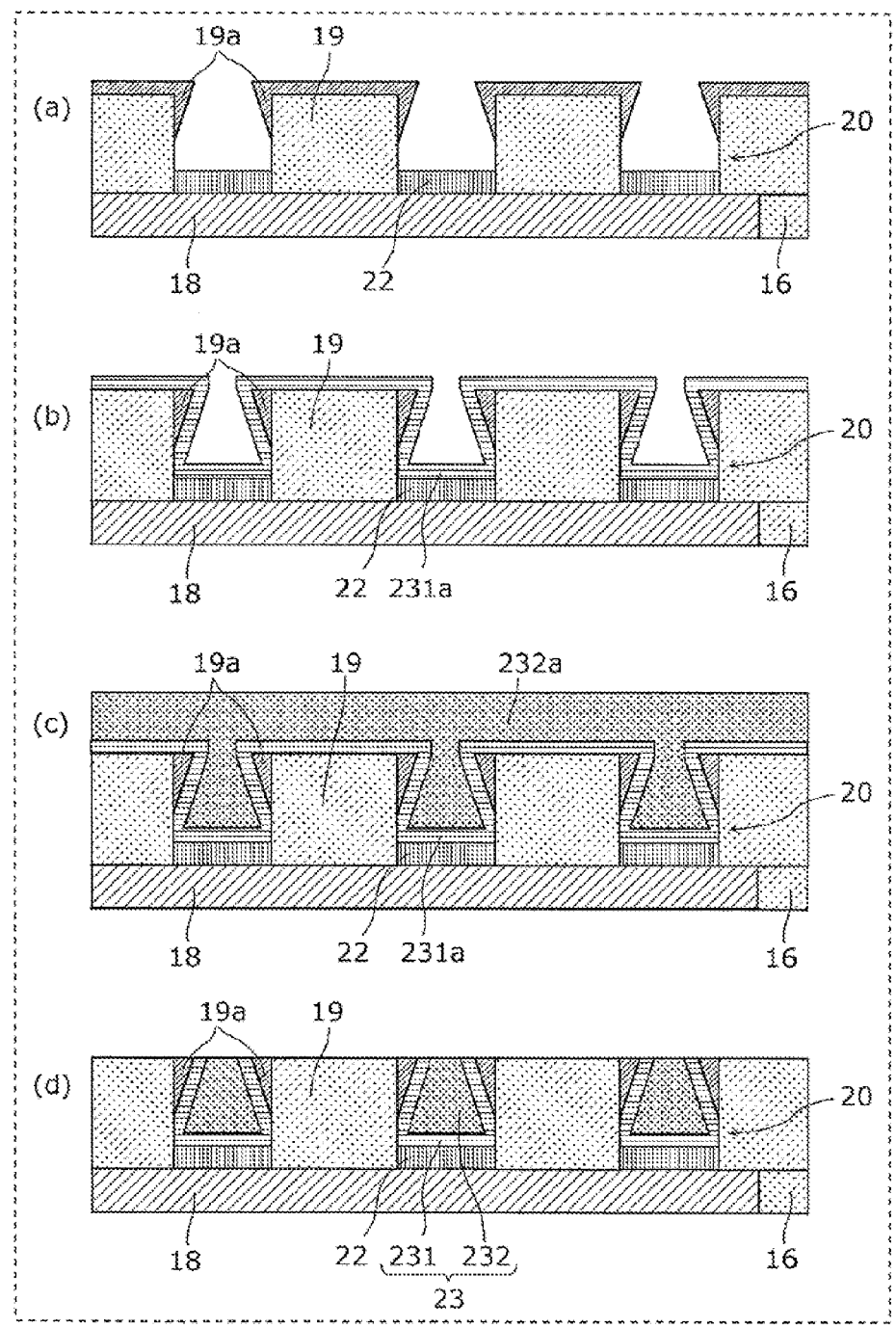

Parts (a) to (d) of FIG. 17 illustrate steps of embedding and forming, from a state in which a metal electrode layer is formed on the bottom of each of memory cell holes, a variable resistance layer having a stack structure which includes two layers having different oxygen content percentages on and above the metal electrode layer, in a method for manufacturing the variable resistance nonvolatile storage device according to Embodiment 4 of the present invention.

Figure 18:
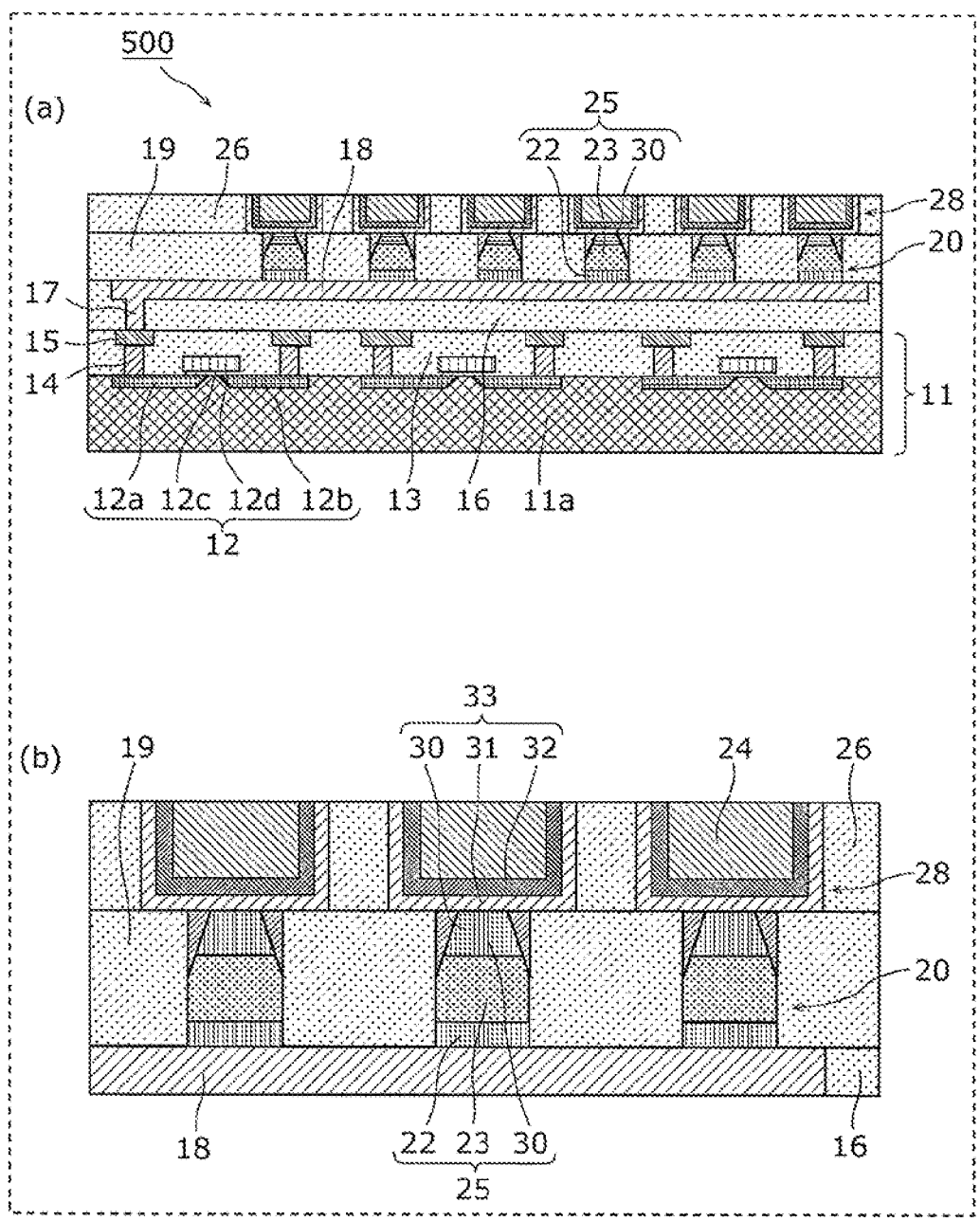

Part (a) of FIG. 18 is a cross-sectional view illustrating a structure of a variable resistance nonvolatile storage device according to Embodiment 5 of the present invention. Part (b) of FIG. 18 is a cross-sectional view of an important part for illustrating a structure of variable resistance elements and diode elements of the variable resistance nonvolatile storage device according to Embodiment 5 of the present invention.

Figure 19:
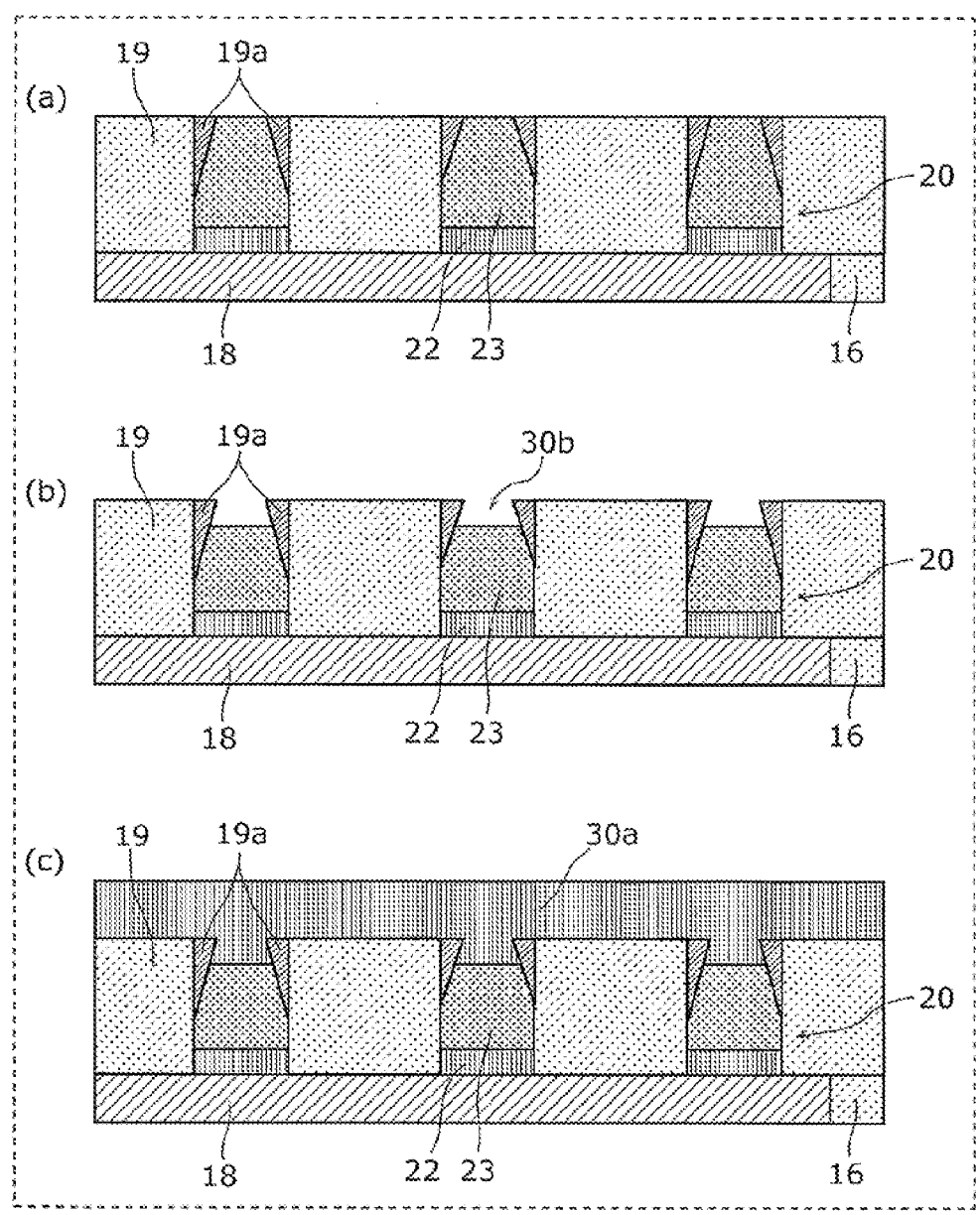

Parts (a) to (c) of FIG. 19 illustrate steps of forming memory cell holes each having an eaves-like shaped inner wall portion in the vicinity of an opening of the memory cell hole, removing a portion of an upper layer portion of the variable resistance layer in the vicinity of the opening of each of the memory cell holes to form a recess from a state in which the variable resistance layer fills the memory cell holes, and thereafter embedding and forming an electrode thin film layer which is to serve as an intermediate electrode layer in each of the recesses, on the upper layer side of the memory cell holes, the steps being included in a method for manufacturing the variable resistance nonvolatile storage device according to Embodiment 5 of the present invention.

Figure 20:
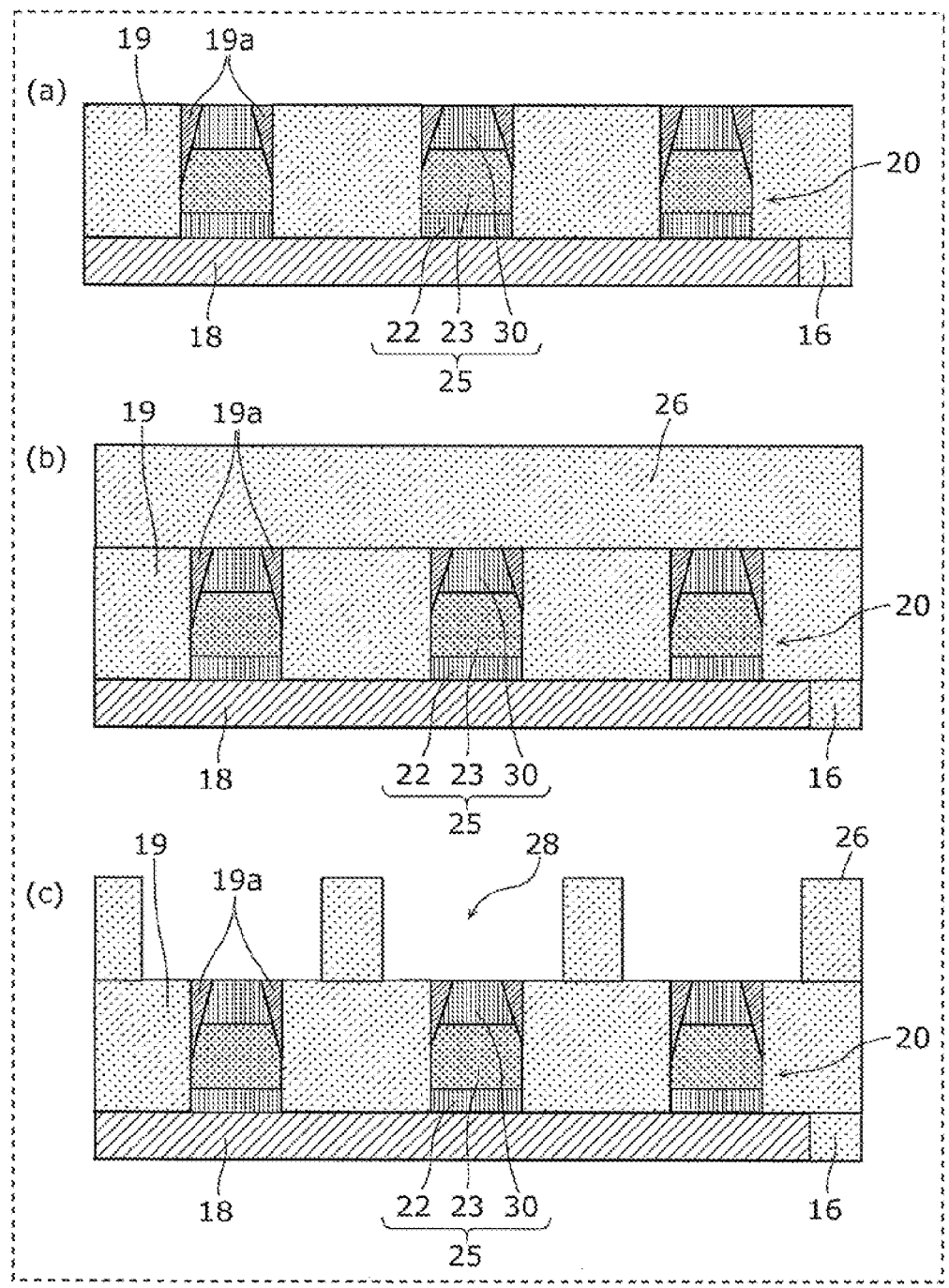

Parts (a) to (c) of FIG. 20 illustrate steps of embedding and forming an intermediate electrode layer, further forming an interlayer insulating layer on an interlayer insulating layer which includes the intermediate electrode layer, and forming, in the interlayer insulating layer, line trenches for embedding and forming diode elements and upper lines connected to the intermediate electrode layer, the steps being included in the method for manufacturing the variable resistance nonvolatile storage device according to Embodiment 5 of the present invention.

Figure 21:
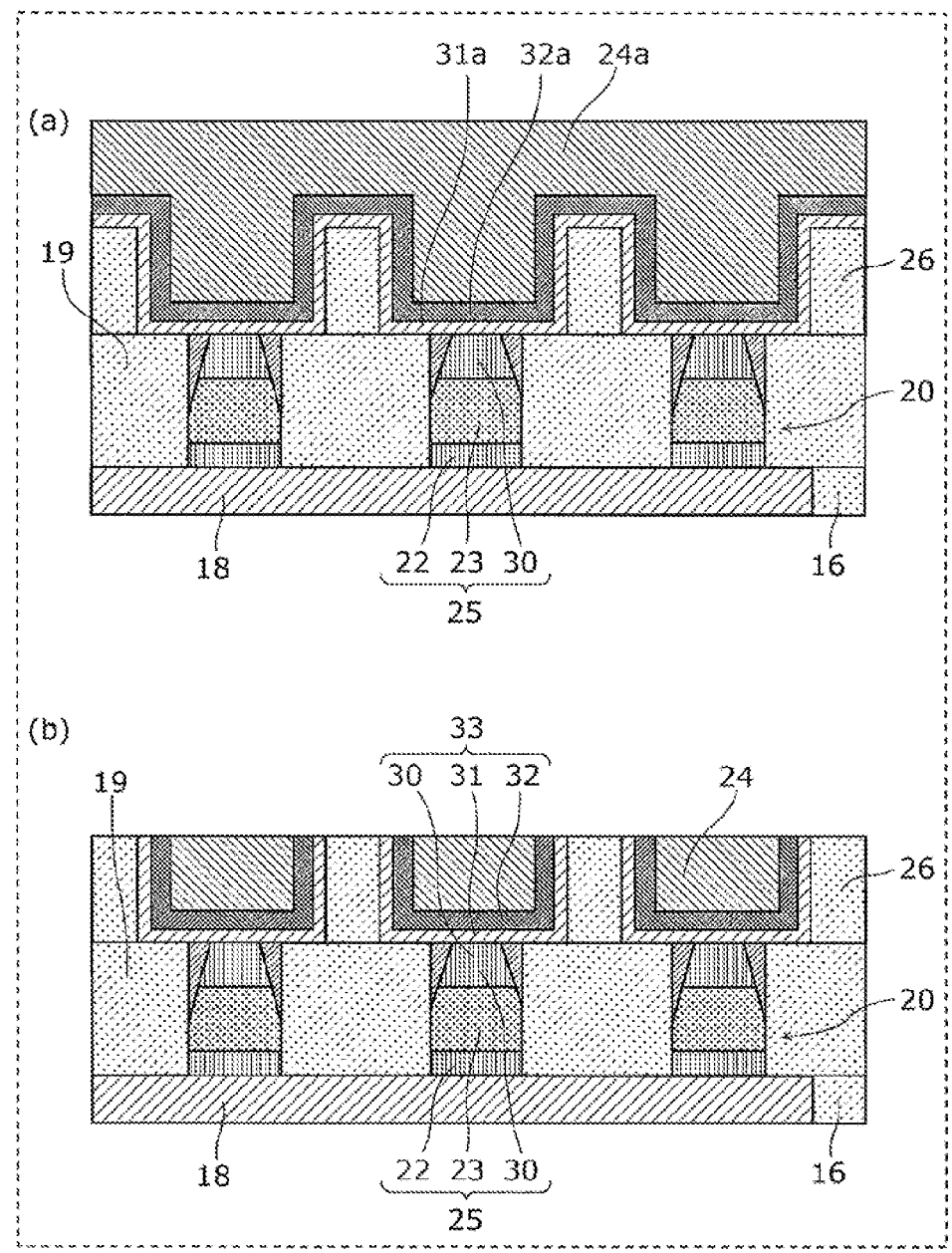

Parts (a) and (b) of FIG. 21 illustrate processes of embedding and forming the diode elements and upper copper lines in the line trenches in the interlayer insulating layer, in the method for manufacturing the variable resistance nonvolatile storage device according to Embodiment 5 of the present invention.

Figure 22:
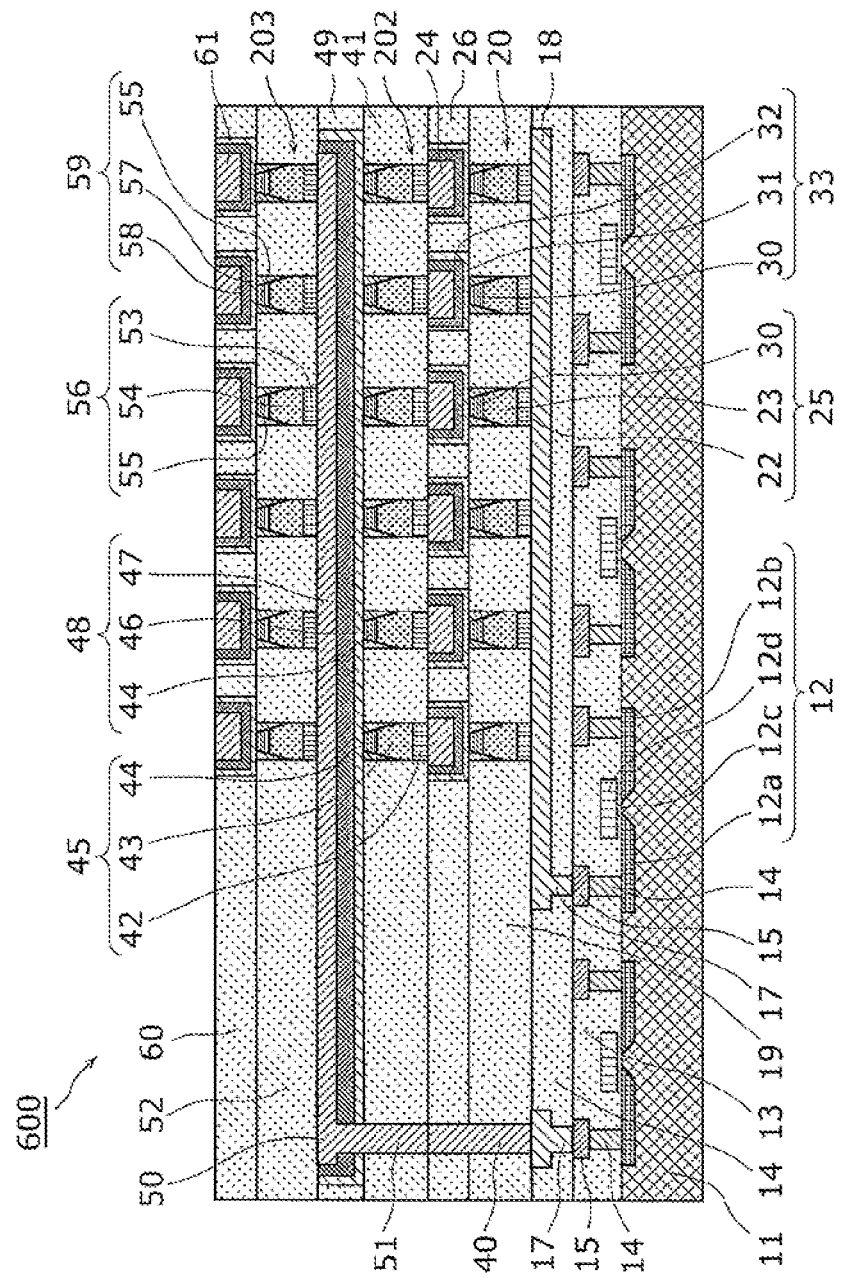

FIG. 22 is a cross-sectional view illustrating a structure of a variable resistance nonvolatile storage device according to Embodiment 6 of the present invention.

Figure 23:
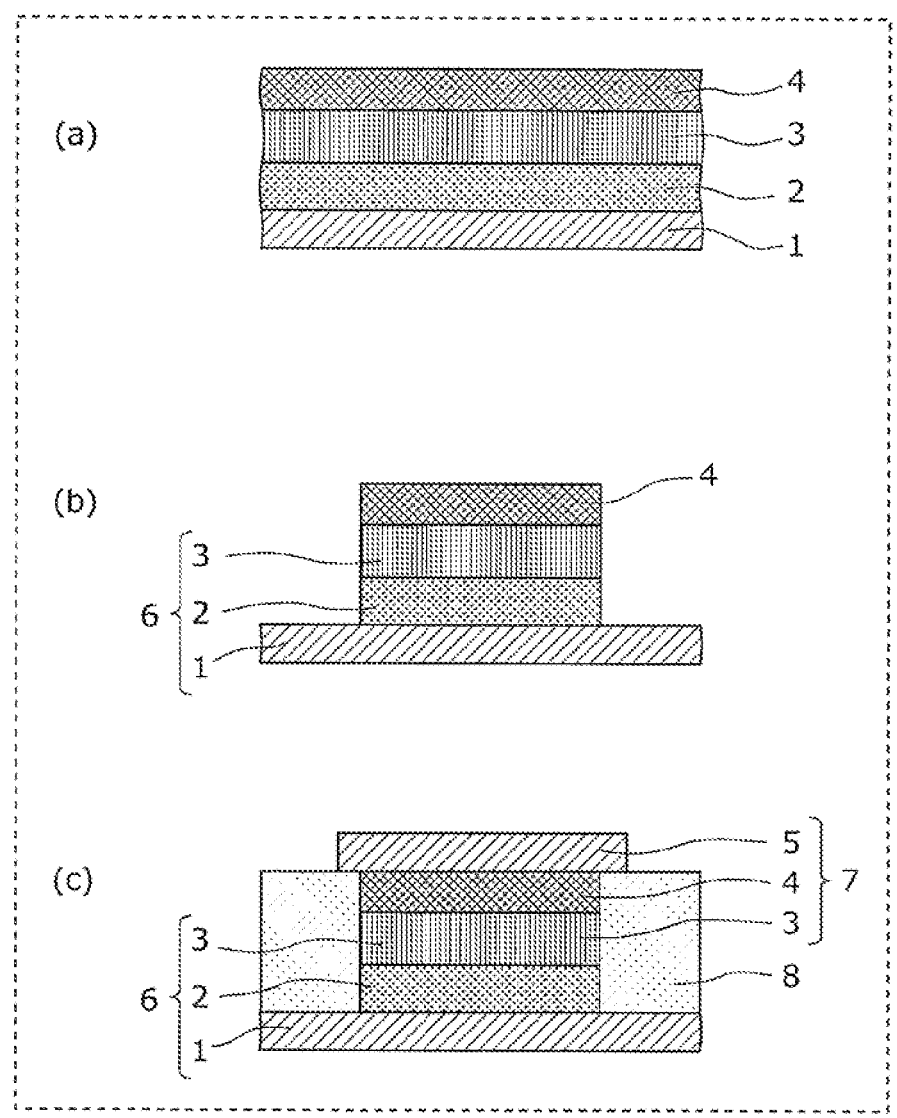

Parts (a) to (c) of FIG. 23 illustrate main steps of a conventional method for manufacturing a variable resistance element.

DESCRIPTION OF EMBODIMENTS

A method for manufacturing a variable resistance nonvolatile storage device according to an aspect of the present invention includes: (a) forming plural lower lines above a substrate; (b) forming an interlayer insulating layer on the plural lower lines and above the substrate; (c) forming, in the interlayer insulating layer, plural memory cell holes penetrating to surfaces of the plural lower lines, an opening diameter of upper portions of the plural memory cell holes being smaller than an opening diameter of bottom portions; (d) forming a metal electrode layer at least on a bottom of each of the plural memory cell holes by sputtering; (e) embedding and forming a variable resistance layer in each of the plural memory cell holes, the variable resistance layer being connected to the metal electrode layer; and (f) forming, on the interlayer insulating layer and the variable resistance layer, plural upper lines connected to the variable resistance layer embedded and formed in each of the plural memory cell holes.

Accordingly, the opening diameter of the upper portions of the memory cell holes for forming the metal electrode layer on the bottoms thereof is smaller than the opening diameter of the bottom portions. Thus, when forming the metal electrode layer, the metal electrode layer is deposited only on the bottoms of the memory cell holes, or on the bottoms and the inner wall portions in the vicinity of the bottoms, thereby preventing the metal electrode layer (lower electrodes) and the upper lines (upper electrodes) from being electrically conducted (short circuited). Consequently, for example, only on the bottoms of the memory cell holes or on the bottoms and the inner wall portions in the vicinity of the bottoms, the metal electrode layer can be formed as a thin film having a thickness of several to several tens nm. This is one of the most advantageous methods when manufacturing a variable resistance element (for example, cross-point ReRAM) in each memory cell hole having a minute diameter of 100 nm or less provided in the interlayer insulating layer.

Here, as one method for manufacturing memory cell holes having such a distinctive structure, step (c) may include: (i) forming, in the interlayer insulating layer, plural memory cell holes penetrating to the surfaces of the plural lower lines, an opening diameter of the upper portions of the plural memory cell holes being greater than or equal to an opening diameter of the bottom portions, and (ii) forming an insulating film on an upper inner wall of each of the plural memory cell holes formed in step (i) in order for the opening diameter of the upper portions of the plural memory cell holes to be smaller than a diameter of the bottoms of the plural memory cell holes. Accordingly, the insulating film having a reverse tapered shape is deposited on the upper inner walls of the memory cell holes, and thereby eaves-like shaped memory cell holes are formed so that the opening diameter of the upper portions of the memory cell holes is smaller than the diameter of the bottom portions of the memory cell holes. Thus, the metal electrode layer is deposited only on the bottoms of the memory cell holes, or on the bottoms and the inner wall portions in the vicinity of the bottoms, thereby preventing the metal electrode layer (lower electrodes) and the upper lines (upper electrodes) from being electrically conducted (short circuited).

At this time, in step (ii), at least one selected from a group including $SiO_2$, SiN, $TaO_x$, $NbO_x$, and $SrO_x$ may be deposited as the insulating film.

As another method for manufacturing memory cell holes having a distinctive structure as described above, step (b) may include forming, as the interlayer insulating layer, a lower interlayer insulating layer on the plural lower lines and above the substrate, and an upper interlayer insulating layer on the lower interlayer insulating layer, and step (c) may include: (i) forming, in the lower interlayer insulating layer and the upper interlayer insulating layer, plural memory cell holes penetrating to the surfaces of the plural lower lines; and (ii) increasing, by wet etching, an opening diameter of portions, of the plural memory cell holes formed in step (i), penetrating the lower interlayer insulating layer relative to an opening diameter of portions, of the plural memory cell holes formed in step (i), penetrating the upper interlayer insulating layer in order for the opening diameter of the portions penetrating the upper interlayer insulating layer to be smaller than the opening diameter of the portions penetrating the lower interlayer insulating layer. Accordingly, the interlayer insulating layer has a structure which includes at least two layers including the lower interlayer insulating layer and the upper interlayer insulating layer, and with regard to the memory cell holes penetrating the layers, only a portion of each memory cell hole in the lower interlayer insulating layer is extended by etching, thereby forming eaves-like shaped memory cell holes such that the opening diameter of the upper portions of the memory cell holes is smaller than the diameter of the bottom portions of the memory cell holes. Thus, the metal electrode layer is deposited only on the bottoms of the memory cell holes, or on the bottoms and the inner wall portions in the vicinity of the bottoms, thereby preventing the metal electrode layer (lower electrodes) and the upper lines (upper electrodes) from being electrically conducted (short circuited).

Here, step (e) may include: (i) forming a first variable resistance layer on the metal electrode layer; and (ii) forming a second variable resistance layer on the first variable resistance layer, the first variable resistance layer and the second variable resistance layer may comprise a same type of metal oxide, and an oxygen content percentage of the first variable resistance layer may be higher than an oxygen content percentage of the second variable resistance layer.

It should be noted that in step (d), the metal electrode layer may be formed on the bottom, and on an inner wall portion in vicinity of the bottom of each of the plural memory cell holes. Even if the metal electrode layer is formed on the bottom and the inner wall portion in the vicinity of the bottom of each of the memory cell holes, the metal electrode layer and the upper lines (upper electrodes) are prevented from being short circuited, unless the metal electrode layer is formed on upper inner walls.

In addition, preferably, the metal electrode layer comprises at least one metal selected from a group including gold (Au), silver (Ag), platinum (Pt), palladium (Pd), iridium (Ir), and ruthenium (Ru).

Accordingly, the variable resistance elements each of which includes the metal electrode layer, the variable resistance layer, and one of the upper lines can obtain favorable resistance change characteristics.

The manufacturing method may further include (g) forming, on the variable resistance layer, diode elements each connected to the variable resistance layer, wherein in step (a), the plural lower lines may be formed into stripes on the substrate, and in step (f), the plural upper lines may be formed into stripes and three-dimensionally cross the plural lower lines, the plural upper lines being connected to upper electrodes of the diode elements.

Accordingly, a variable resistance nonvolatile storage device which includes memory cells having the variable resistance elements and the diode elements connected in series can be manufactured, and a super-integratable cross-point variable resistance nonvolatile storage device can be manufactured.

In addition, the process from forming the interlayer insulating layer up to forming the upper lines can be repeated to form a storage element layer which includes the variable resistance layer and the diode elements, thereby further stacking the storage element layer above the lower lines.

This multilayer structure enables a cross-point variable resistance nonvolatile storage device having still larger capacity to be manufactured.

In order to solve the above problems, a variable resistance nonvolatile storage device according to an aspect of the present invention includes: a substrate; plural lower lines formed above the substrate; an interlayer insulating layer formed on the plural lower lines and above the substrate, and having formed therein plural memory cell holes penetrating to surfaces of the plural lower lines, an opening diameter of upper portions of the plural memory cell holes being smaller than an opening diameter of bottom portions; a metal electrode layer formed on a bottom of each of the plural memory cell holes; a variable resistance layer embedded and formed in each of the plural memory cell holes, the variable resistance layer being connected to the metal electrode layer; and plural upper lines formed on the interlayer insulating layer and the variable resistance layer, and connected to the variable resistance layer embedded and formed in each of the plural memory cell holes.

Thus, the opening diameter of the upper portions of the memory cell holes for forming the metal electrode layer on the bottoms thereof is smaller than the opening diameter of the bottom portions. Thus, when forming the metal electrode layer, the metal electrode layer is deposited only on the bottoms of the memory cell holes, or on the bottoms and the inner wall portions in the vicinity of the bottoms, thereby preventing the metal electrode layer (lower electrodes) and the upper lines (upper electrodes) from being electrically conducted (short circuited). Consequently, it is possible to form variable resistance elements in memory cell holes having a minute diameter of 100 nm or less and provided in the interlayer insulating layer, for example.

Here, as an example of such a distinctive structure of a memory cell hole, the plural memory cell holes may each include an insulating film formed on an upper inner wall in order for an opening diameter of upper portions of the plural memory cell holes to be smaller than a diameter of the bottoms of the plural memory cell holes.

At this time, preferably, the insulating film comprises at least one selected from a group including $SiO_2$, SiN, $TaO_x$, $NbO_x$, and $SrO_x$.

Consequently, it is possible to provide plural memory cell holes whose upper portions having an opening diameter smaller than the opening diameter of the bottom portions, and form variable resistance elements in memory cell holes having a minute diameter of 100 nm or less.

In addition, as another example of a distinctive structure as described above of the memory cell holes, the interlayer insulating layer may include a lower interlayer insulating layer formed on the plural lower lines and above the substrate, and an upper interlayer insulating layer formed on the lower interlayer insulating layer, the plural memory cell holes may penetrate the lower interlayer insulating layer and the upper interlayer insulating layer to the surfaces of the plural lower lines, and an opening diameter of portions, of the plural memory cell holes, penetrating the upper interlayer insulating layer may be smaller than an opening diameter of portions, of the plural memory cell holes, penetrating the lower interlayer insulating layer. Accordingly, the insulating film having a reverse tapered shape is deposited on the upper inner walls of the memory cell holes, and thereby eaves-like shaped memory cell holes are formed so that the opening diameter of the upper portions of the memory cell holes is smaller than the diameter of the bottom portions of the memory cell holes. Thus, the metal electrode layer is deposited only on the bottoms of the memory cell holes, or on the bottoms and the inner wall portions in the vicinity of the bottoms, thereby preventing the metal electrode layer (lower electrodes) and the upper lines (upper electrodes) from being electrically conducted (short circuited).

Consequently, it is also possible to provide plural memory cell holes whose upper portions having an opening diameter smaller than the opening diameter of the bottom portions, and form variable resistance elements in the memory cell holes having a minute diameter of 100 nm or less.

Here, the variable resistance layer may include a first variable resistance layer formed on the metal electrode layer, and a second variable resistance layer formed on the first variable resistance layer, the first variable resistance layer and the second variable resistance layer may comprise a same type of metal oxide, and an oxygen content percentage of the first variable resistance layer may be higher than an oxygen content percentage of the second variable resistance layer.

In addition, the metal electrode layer may comprise at least one metal selected from a group including gold (Au), silver (Ag), platinum (Pt), palladium (Pd), iridium (Ir), and ruthenium (Ru).

This allows the variable resistance elements each including the metal electrode layer, the variable resistance layer, and one of the upper lines to achieve favorable resistance change characteristics.

In addition, the variable resistance nonvolatile storage device may further include diode elements on the variable resistance layer, the diode elements being connected to the variable resistance layer, wherein the plural lower lines may be formed into stripes on the substrate, and the plural upper lines may be formed into stripes and three-dimensionally cross the plural lower lines, the plural upper lines being connected to upper electrodes of the diode elements.

Accordingly, a variable resistance nonvolatile storage device which includes memory cells having the variable resistance elements and the diode elements connected in series can be manufactured, a super-integratable cross-point variable resistance nonvolatile storage device can be manufactured.

Furthermore, the variable resistance nonvolatile storage device may further include one or more stacked layers each formed of a structural unit which includes the interlayer insulating layer and the metal electrode layer formed on the plural lower lines, and the variable resistance layer, the diode elements, and the plural upper lines formed above the plural lower lines, wherein in each stacked layer formed of the structural unit, the plural upper lines in a layer positioned under the stacked layer and formed of the structural unit may serve as the plural lower lines in the stacked layer formed of the structural unit.

This multilayer structure enables a cross-point variable resistance nonvolatile storage device having still larger capacity to be manufactured.

The following is a description of embodiments of the present invention, with reference to the drawings. It should be noted that the same signs are given to the same elements, and a description thereof may be omitted. In addition, the shapes of a transistor, a variable resistance element, and the like are schematically shown, and the number thereof is based on ease of illustration. Each of the embodiments described below shows a preferred specific example of the present invention. The numerical values, shapes, materials, constituent elements, the arrangement and connection of the constituent elements, steps, the processing order of the steps and the like described in the following embodiments are mere examples, and thus are not intended to limit the scope of the claims. Therefore, among the constituent elements in the following embodiments, constituent elements not recited in any one of the independent claims showing the broadest concept of the present invention are described as arbitrary constituent elements which form more preferred embodiments.

[Embodiment 1]

Figure 1:
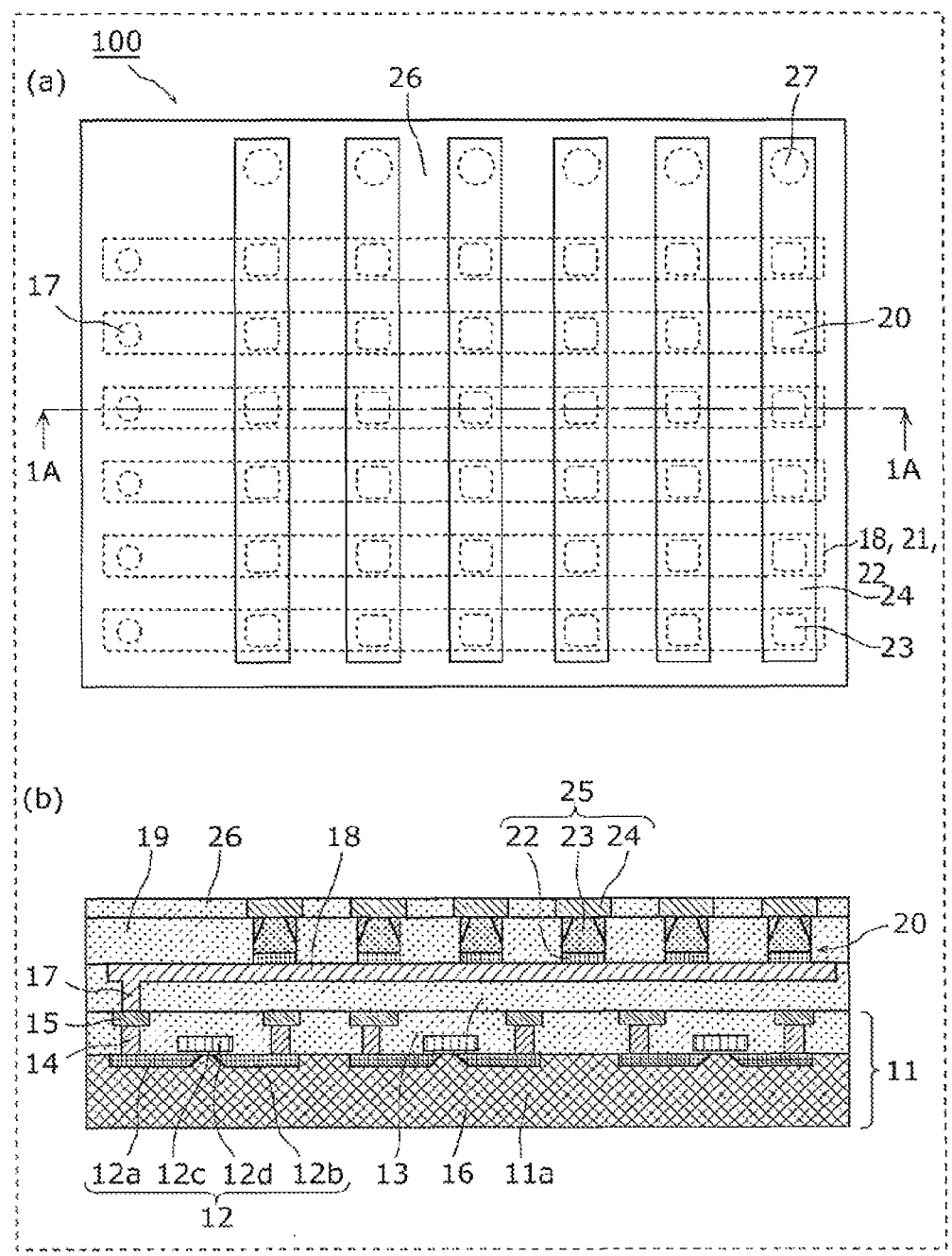
Figure 2:
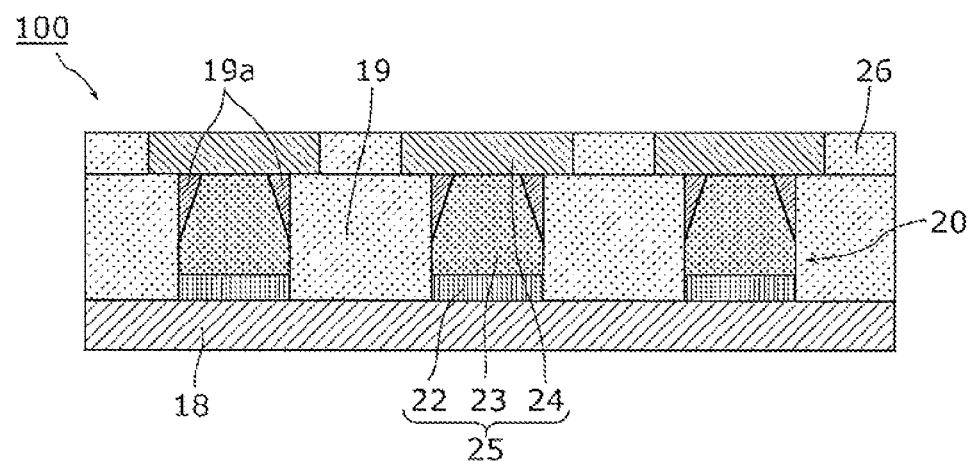
FIG. 2 is a cross-sectional view of an important part for illustrating a structure of variable resistance elements of the variable resistance nonvolatile storage device according to Embodiment 1 of the present invention.

Parts (a) and (b) of FIG. 1 illustrate a structure of a variable resistance nonvolatile storage device 100 according to Embodiment 1 of the present invention. Part (a) of FIG. 1 is a plan view, and (b) of FIG. 1 is a cross-sectional view taken along line 1A-1A illustrated in (a) of FIG. 1 and showing the variable resistance nonvolatile storage device 100 viewed in the arrow direction. FIG. 2 is a cross-sectional view illustrating an enlarged important part for showing the structure of a variable resistance element 25.

As illustrated in (a) and (b) of FIG. 1 and FIG. 2, the variable resistance nonvolatile storage device 100 according to the present embodiment includes: a substrate 11; a second interlayer insulating layer 16 formed on the substrate 11; plural embedded conductors 17 and plural lower lines 18 formed in the second interlayer insulating layer 16; a third interlayer insulating layer 19 formed on and above the second interlayer insulating layer 16 and on the plural lower lines 18, and having plural memory cell holes 20; a metal electrode layer 22 formed in each of the memory cell holes 20; a variable resistance layer 23 embedded and formed in each of the memory cell holes 20 so as to be connected to the metal electrode layer 22; a fourth interlayer insulating layer 26 formed on the third interlayer insulating layer 19; and upper lines 24 formed in the fourth interlayer insulating layer 26 and on the third interlayer insulating layer 19 and the variable resistance layers 23, and each connected to the variable resistance layer 23.

The memory cell holes 20 are formed in the third interlayer insulating layer so as to penetrate to the surfaces of the lower lines 18. Here, the third interlayer insulating layer 19 is an example of an "interlayer insulating layer" according to the present invention. The memory cell holes 20 each include a different insulating film 19a at an upper portion of the memory cell hole 20, and accordingly the memory cell holes 20 have an eaves-like shaped structure, the opening diameter of the upper portions of the memory cell holes 20 being smaller than that of the bottom portions (see FIG. 2). In addition, the metal electrode layer 22 is formed, by sputtering, on the bottom of each of the memory cell holes 20 or on the bottom and the inner wall in the vicinity of the bottom of each of the memory cell holes 20.

The variable resistance nonvolatile storage device according to the present embodiment does not necessarily include all the constituent elements illustrated in FIG. 1. FIG. 2 illustrates the main part in FIG. 1, or specifically, the minimum number of constituent elements of the variable resistance nonvolatile storage device according to the present embodiment. As illustrated in this drawing, the variable resistance nonvolatile storage device according to the present embodiment includes at least (i) the substrate 11 (not illustrated), (ii) the plural lower lines 18 formed on the substrate 11, (iii) the interlayer insulating layer (third interlayer insulating layer 19) formed on the plural lower lines 18 and above the substrate 11, and having therein the plural memory cell holes 20 formed so as to reach the surfaces of the lower lines 18 and formed so that the opening diameter of the upper portions is smaller then that of the bottom portions, (iv) the metal electrode layer 22 formed on the bottom of each of the plural memory cell holes 20 or on the bottom and the inner wall in the vicinity of the bottom of each of the memory cell holes 20, (v) the variable resistance layer 23 embedded and formed in each of the plural memory cell holes 20 so as to be connected to the metal electrode layer 22, and (vi) the plural upper lines 24 formed on the interlayer insulating layer (the third interlayer insulating layer 19) and the variable resistance layer 23, and each connected to the variable resistance layer 23.

Here, "the upper portions" of the memory cell holes 20 means an area of the upper half of the memory cell holes 20 in the depth direction, or more specifically, indicates the uppermost ends (openings) of the memory cell holes 20 and the vicinity thereof. Further, the "opening diameter" of the memory cell holes 20 means the diameter of a circle when a cross section obtained by cutting the memory cell holes 20 in the direction parallel to the main surface of the substrate (external shape of the memory cell holes 20) has a circular shape, whereas the "opening diameter" means the length of a side (shortest side) when the cross section is a rectangle. Further, "the bottom portions" of the memory cell holes 20 (or simply "the bottom portions") means the lower half of the memory cell holes 20 in the depth direction, or more specifically, indicates the bottom surfaces of the memory cell holes 20. Further, "the inner walls (portions) in the vicinity of the bottoms" of the memory cell holes 20 means the lower half of the inner walls of the memory cell holes 20 in the depth direction. Further, "inner walls (inner wall portions)" of the memory cell holes 20 means the internal surfaces except the bottom surfaces of the memory cell holes 20.

Furthermore, "the opening diameter of the upper portions is smaller than the opening diameter of the bottom portions" means a structure in which the upper portion of each of the memory cell holes 20 is narrower than the bottom portion, or in other words, the expression means that "eaves (inverse tapered shape portion)" are formed on the upper portion of each of the memory cell holes 20. For example, it is sufficient that the ratio of the opening diameter of the memory cell holes 20 at the uppermost ends to the opening diameter of the memory cell holes 20 at the bottoms is less than 1, and preferably, the ratio is 0.82 or less, or more preferably, 0.72 or less. The ratio may be determined as appropriate depending on the external dimension and the aspect ratio of the memory cell holes 20, the material and the method of manufacturing the insulating film 19a which forms eaves (inverse tapered portions), the material and the method of manufacturing the metal electrode layer 22 deposited on the bottoms, and the like. In short, the size of "eaves (inverse tapered portions)" may be determined as appropriate such that the metal electrode layer 22 is deposited only on the bottom of each of the memory cell holes 20 or only on the bottom and the inner wall in the vicinity of the bottom of each of the memory cell holes 20. Consequently, short circuits between the metal electrode layer (lower electrodes) 22 and the upper lines (upper electrodes) 24 are avoided.

The substrate 11 in this specification is a semiconductor substrate. In the present embodiment, as an example, a semiconductor circuit substrate which includes active elements 12 such as transistors integratedly formed on a silicon substrate 11a, and the first interlayer insulating layer 13 disposed on the silicon substrate 11a is used as the substrate 11, as illustrated in (b) of FIG. 1. Although (b) of FIG. 1 illustrates, as the active elements 12, transistors each including a source area 12a, a drain area 12b, a gate insulating film 12c, and a gate electrode 12d, the active elements 12 provided in the substrate 11 are not limited to such transistors, and each generally include an element necessary for a memory circuit such as DRAM.

The lower lines 18 are formed into stripes, and disposed at spacings in the direction along the width of the stripes. Various conductive materials can be used for the embedded conductors 17 and the lower lines 18, and the embedded conductors 17 and the lower lines 18 comprise copper, for example.

It should be noted that although (b) of FIG. 1 illustrates a structure in which the plural variable resistance elements 25 are connected to the active elements 12 via the plural stripe-shaped lower lines 18 and the embedded conductors 17 formed in the second interlayer insulating layer 16, the structure of the variable resistance nonvolatile storage device according to the present embodiment is not limited to such a structure. For example, when one memory cell includes one variable resistance element (R) and one selection transistor (T) (i.e., a 1T1R memory cell), the lower electrodes of the variable resistance elements are connected to the transistors in one-to-one correspondence.

The metal electrode layer 22 may comprise a metal element. In particular, the metal electrode layer 22 preferably comprises a platinum group precious metal, to exhibit resistance change characteristics adequately. It should be noted that the metal electrode layer 22 may comprise two or more types of layered metals, the metals may be doped with another metal, or an alloy of the metals may be used. Furthermore, when the material used for the metal electrode layer 22 is an alloy of two or more types of metals, which includes an electrode material which tends to migrate to the variable resistance layer 23 and an electrode material which does not tend to migrate thereto, a resistance change phenomenon can be stably caused. Further, the interface between the metal electrode layer 22 and the variable resistance layer 23 can be maintained flat by decreasing the level of the migration of the metal electrode layer 22 to the variable resistance layer 23, thereby reducing the variations in the resistance change characteristics. This is because if the interface is not flat due to the migration of the electrode material of the metal electrode layer 22 to the variable resistance layer 23, the resistance change characteristics may greatly vary due to the concentration of electric fields on the protruding portions of the metal electrode layer 22.

The variable resistance nonvolatile storage device 100 further includes the plural upper lines 24 formed into stripes on the third interlayer insulating layer 19, in the direction in which the upper lines 24 are three-dimensionally crossing the lower lines 18 (for example, in the direction in which the upper lines 24 are crossing the lower lines 18 at right angles when viewed from above). The upper lines 24 are formed into stripes, and disposed at spacings in the direction along the width of the stripes. Various conductive materials can be used for the upper lines 24, and the upper lines 24 comprise copper, for example.

The plural memory cell holes 20 are formed at cross-points of the plural upper lines 24 and the plural lower lines 18 which are three-dimensionally crossing. The plural memory cell holes 20 are formed so as to each have an opening, which allows the surfaces of the lower lines 18 to be exposed from the bottoms of the memory cell holes 20.

The metal electrode layer 22 is formed on the lower lines 18 in the bottom openings of the memory cell holes 20.

The variable resistance layer 23 is formed on the metal electrode layer 22 so as to fill each of the memory cell holes 20. The variable resistance elements 25 each include the variable resistance layer 23, the metal electrode layer 22 connected to the variable resistance layer 23, and one of the upper lines 24. As the variable resistance layer 23, an oxygen-deficient transition metal oxide film or a perovskite-based oxide film may be used. Examples of an oxygen-deficient transition metal oxide film to be used include a tantalum oxide film ($TaO_x$), a nickel oxide film ($NiO_x$), a hafnium oxide film ($HfO_x$), an iron oxide film ($FeO_x$), a vanadium oxide film ($VO_x$), a zinc oxide film ($ZnO_x$), a niobium oxide film ($NbO_x$), a titanium oxide film ($TiO_x$), a tungsten oxide film ($WO_x$), a cobalt oxide film ($CoO_x$), a copper oxide film ($CuO_x$), and the like. As a perovskite-based oxide film, $PrCaMnO_3$, $LaCaMnO_3$, or $SrTiO_3$ can be used, for example.

An oxygen-deficient tantalum oxide ($TaO_x$) is preferable among these in consideration of the stability of resistance change characteristics and repeatability of the production. The following describes an example in which the variable resistance layer 23 comprises an oxygen-deficient tantalum oxide ($TaO_x$). Here, the term "oxygen-deficient" means a composition having a smaller amount of oxygen than the stoichiometry with regard to the composition ratio of Ta to O when represented by $TaO_x$. The stoichiometry of a tantalum oxide is $Ta_2O_5$, and thus the range of x in oxygen-deficient $TaO_x$ is $0<x<2.5$. Preferably, the range of x in $TaO_x$ is $0.8 \leq X \leq 1.9$.

It should be noted that as illustrated in (a) of FIG. 1, the upper lines 24 extend beyond the area where the variable resistance elements 25 are formed in matrix. Further, the lower lines 18 and the upper lines 24 are electrically connected to the active elements 12, respectively, in an area other than the matrix area in which the variable resistance elements 25 are formed. Accordingly, in (b) of FIG. 1, the lower lines 18 are electrically connected to source areas 12a of the active elements 12 via the embedded conductors 17, circuit lines 15, and embedded conductors 14. It should be noted that the upper lines 24 may also be connected to other active elements via embedded conductors 27 (see (a) of FIG. 1), which is not illustrated in (b) of FIG. 1.

In the present embodiment, as the third interlayer insulating layer 19 and the fourth interlayer insulating layer 26, a silicon oxide film ($SiO_2$ film) formed by chemical vapor deposition (CVD), a TEOS-$SiO_2$ film formed by CVD using ozone ($O_3$) and a tetraethoxysilane (TEOS), a silicon carbonation film which comprises a low dielectric constant material (SiOC film), a silicon fluorine oxidation film (SiOF film), or the like may be used.

The third interlayer insulating layer 19 may have a stack structure to allow the memory cell holes 20 to be formed with ease. For example, if the third interlayer insulating layer 19 includes an upper layer and a lower layer, the lower layer may be a film having etching resistance to dry etching, and the upper layer may comprise another insulating material. For example, as a film having etching resistance to dry etching using fluorocarbon etching gas such as $C_4F_8$ and $C_5F_8$, a film formed by CVD, such as a silicon nitride (SiN) film, a silicon oxynitride (SiON) film, or a silicon carbonitride (SiCN) film, can be used. In contrast, an insulating oxide material other than SiN and SiON mentioned above can be used for the upper layer.

The variable resistance layer 23 included in each of the variable resistance elements 25 can be formed, using the oxygen-deficient transition metal oxide described above, by reactive sputtering in which a metal target is sputtered in an atmosphere including oxygen, for instance. The state of such an oxygen-deficient transition metal oxide material transitions to a specific resistance state when a voltage or current that is at or greater than a certain threshold is applied, and the resistance state is maintained until a voltage or current that is at or greater than a different threshold is newly applied.

A method for manufacturing the variable resistance nonvolatile storage device 100 according to the present embodiment is described with reference to (a) and (b) of FIG. 3, (a) to (d) of FIG. 4, (a) and (b) of FIG. 5, and (a) to (c) of FIG. 6. Although a description is given, using signs such as process (A), process (B), and process (C) in this specification, such signs are intended to be used to facilitate and clarify the description, and do necessarily show the order of the processes. Thus, changes can be made as appropriate by omitting, replacing, or performing in parallel some of the processes, or adding a known process, for instance.

It should be noted that (a) and (b) of FIG. 3, (a) to (d) of FIG. 4, (a) and (b) of FIG. 5, and (a) to (c) of FIG. 6 illustrate a structure which includes only the second interlayer insulating layer 16 having therein the lower lines 18 and elements on and above the layer, to simplify the drawings. The following is a description of an example in which the lower lines 18 and the upper lines 24 comprise copper. For this reason, the "lower lines 18" may be referred to as "lower copper lines 18", and the "upper lines 24" may be referred to as "upper copper lines 24". This is intended to simplify the description, and thus the present invention is not limited to these.

Parts (a) and (b) of FIG. 3 illustrate a process of forming the third interlayer insulating layer 19 on the lower copper lines 18 embedded and formed in the second interlayer insulating layer 16.

First, as illustrated in (a) of FIG. 3, the lower copper lines 18 are embedded and formed in the second interlayer insulating layer 16. The lines can be formed as described below. First, stripe-shaped line trenches for embedding the lower copper lines 18 in the second interlayer insulating layer 16 are formed. The line trenches can be formed with ease by using photolithography and insulating film etching technique used in a general semiconductor process. Next, on the second interlayer insulating layer 16 which includes the line trenches, a conductor film comprising copper, for instance, is deposited using sputtering, CVD, or electrolytic plating, thereby filling the line trenches with the conductor film. After that, unnecessary portions of the conductor film on the second interlayer insulating layer 16 are removed by chemical mechanical polishing (CMP), for example, thereby embedding and forming the lower copper lines 18 each having a shape as illustrated in (a) of FIG. 3. The above process is an example of "process (A) of forming plural lower lines" of the present invention.

It should be noted that the lower copper lines 18 may have a stack structure. For example, the lower copper lines 18 may each include a barrier metal layer formed under a copper layer and a top cap layer formed on the copper layer. This is intended to prevent diffusion of copper to the second interlayer insulating layer 16. For the barrier metal layer and the top cap layer, cobalt-tungsten-phosphorus (CoWP) alloy, titanium-tungsten nitride (TiWN), titanium (Ti), titanium nitride (TiN), tantalum (Ta), tantalum nitride (TaN), or the like is used in general. It should be noted that although a description is omitted in the following, not only the lower copper lines 18 but other copper lines (such as upper copper lines 24) can also be formed so as to have a stack structure, as well.

It should be noted that as illustrated in (a) of FIG. 1, the embedded conductors 17 are embedded and formed in the second interlayer insulating layer 16, in addition to the lower copper lines 18. The embedded conductors 17 and the lower copper lines 18 in the second interlayer insulating layer 16 may be simultaneously formed using a dual damascene process, or may be formed separately using a single damascene process.

Further, for the second interlayer insulating layer 16, fluorine-containing oxide (e.g., SiOF), carbon-containing nitride (e.g., SiCN), or an organic resin material (e.g., polyimide), for instance, is used to reduce parasitic capacitance between the lines.

Next, in the step illustrated in (b) of FIG. 3, the third interlayer insulating layer 19 comprising TEOS-SiO$_2$ is formed using, for example, CVD above the substrate 11, on the lower copper lines 18, and on and above the interlayer insulating layer 16. It should be noted that various materials can be used for the third interlayer insulating layer 19, as previously mentioned. The above process is an example of "process (B) of forming an interlayer insulating layer" of the present invention. In the third interlayer insulating layer 19, the memory cell holes 20 of the present invention are formed whose upper portions having a diameter smaller than that of the bottom portions.

Parts (a) and (b) of FIG. 4 illustrate a process of forming, at predetermined positions of the third interlayer insulating layer 19, the plural memory cell holes 20 which reach the lower copper lines 18, and whose upper portions having an opening diameter smaller than that of the bottom portions, and (c) and (d) of FIG. 4 illustrate a process of forming the metal electrode layer 22 on the bottom of each of the memory cell holes 20 by sputtering.

As illustrated in (a) of FIG. 4, plural memory cell holes 20a penetrating to the surfaces of the lower copper lines 18 are formed in the third interlayer insulating layer 19. In the present embodiment, the memory cell holes 20a are formed at regular spacings along the lower copper lines. The external shape of the memory cell holes 20a is smaller than the width of the lower copper lines 18. It should be noted that although the external shape of the memory cell holes 20a is square in (a) of FIG. 1, the external shape may be circular, elliptic, or even other shapes. The above process is an example of "sub process (C1) of forming plural memory cell holes" according to Embodiment 1, which is included in "process (C) of forming plural memory cell holes" of the present invention.

Next, in the step illustrated in (b) of FIG. 4, the insulating film 19a is deposited in each of the memory cell holes 20a and on the third interlayer insulating layer 19. At least one selected from a group which includes, for example, SiO$_2$, SiN, Ta$_2$O$_5$, NbO$_x$, and SrO$_x$ can be used as a material of the insulating film 19a. Sputtering is preferable as a film forming method. For example, if the diameter of the memory cell holes 20a is 100 nm or less and an aspect ratio is one or more, preferably, the pressure applied when the film is formed is 30 mTorr or lower, and the mean free path is 5 μm or more. If the film is formed under such conditions, sputtered elements are more likely to move in random directions, and thus most of the elements do not deposit on the bottoms of the memory cell holes 20a. As a result, this achieves the shape as shown in (b) of FIG. 4 (an eaves-like shaped structure obtained by inverse tapered portions formed on the upper inner walls of the memory cell holes 20a). Further, the sputtered elements are attracted due to the potential difference between plasma and the substrate, and if this energy is high, the sputtered elements tend to advance straight ahead, and become more likely to deposit on the bottoms of the memory cell holes 20a. Thus, the potential difference between plasma and the substrate is preferably 30 V or lower in order to obtain the shape in (b) of FIG. 4. The above process is an example of "sub process (C2) of depositing an insulating film" according to Embodiment 1, which is included in "process (C) of forming plural memory cell holes" of the present invention. It should be noted that if a film is slightly deposited on the bottoms of the memory cell holes 20a, the film can be removed by etch back.

In addition, as another method for the above sub process (C2), the insulating film 19a can be deposited by using "oblique sputtering" of depositing sputtered elements while rotating a substrate wafer after the centers of a sputtering target and the substrate wafer are displaced. In this case, the elements sputtered from the target do not enter the memory cell holes 20a toward the bottoms, but rather toward the inner walls of the memory cell holes 20a. Thus, the elements tend not to deposit on the bottoms of the memory cell holes 20a, which achieves the shape as illustrated in (b) of FIG. 4.

Next, in the step illustrated in (c) of FIG. 4, a metal electrode layer 29 and the metal electrode layer 22 are formed by sputtering on the insulating film 19a and the bottoms of the memory cell holes 20, respectively. Sputtering at this time is performed to form the layer under the conditions that the tendency of film forming elements to advance straight ahead is increased so that the elements are deposited on the bottoms of the memory cell holes 20a. Accordingly, the pressure applied when the layers are formed is 30 mTorr or higher, thereby decreasing the tendency of sputtered elements to move in random directions, and causing the sputtered elements to float. A substrate bias is applied in this state, and sputtered elements are attracted to the bottoms of the memory cell holes 20a, thereby achieving deposition thereof on the bottoms of the memory cell holes 20a. Specifically, it is preferable to apply a bias to the substrate and cause the potential difference between plasma and the substrate to be 30 V or higher.

Under the above film forming conditions, the elements sputtered from the target can be attracted into the memory cell holes by about 1 μm. Furthermore, as illustrated in (b) of FIG. 4, the opening diameter of the upper portions of the memory cell holes 20a is smaller than the opening diameter of the bottom portions, and thus it is possible to prevent deposition of metal on a portion of the inverse tapered portion on the inner wall of each of the memory cell holes 20a. As described above, features regarding deposition only on the bottom portions of the memory cell holes 20a are improved by the sputtering method with the application of a substrate bias. However, it is physically difficult to completely eliminate variations of the directions in which sputtered elements enter. Accordingly, if the reverse tapered insulating film 19a is not formed, the process of removing metal on the inner wall of each of the memory cell holes 20a is necessary in order to form the metal electrode layer 22 only on the bottom portion of each of the memory cell holes 20a. However, the manufacturing method involving removal of metal only from the inner wall portion of fine memory cell holes by etching is realistically impossible. Therefore, the hole shape having such an inverse tapered structure is extremely useful for depositing metal only on the bottom portions of the memory cell holes 20a.

The metal electrode layer 22 may comprise material which includes a metal element. Preferably, the material includes precious metal elements in order for the layer to exhibit favorable resistance change characteristics. For example, the material preferably comprises one of platinum metals selected from among gold (Au), silver (Ag), platinum (Pt), palladium (Pd), iridium (Ir), and ruthenium (Ru) (i.e., at least one metal selected from a group which includes the metals).

Next, in the step illustrated in (d) of FIG. 4, the metal electrode layer 29 deposited on the insulating film 19a is removed by a CMP process. At this time, a portion of the insulating film 19a may also be removed simultaneously by over polishing. The above process is an example of "process (D) of forming a metal electrode layer" of the present invention.

Next, in the step illustrated in (a) of FIG. 5, a resistance thin film layer 23a to be the variable resistance layer 23 is formed in each of the memory cell holes 20 and on the third interlayer insulating layer 19. In the present embodiment, an oxygen-deficient tantalum oxide layer is formed by sputtering as the variable resistance layer 23. It should be noted that as a method for forming the layer, not only sputtering but CVD, atomic layer deposition (ALD), or the like may be used. Furthermore, after forming a metal Ta film, $TaO_x$ may be formed by performing thermal oxidation processing or plasma oxidation processing on the Ta film.

A metal film on the bottom of each of the memory cell holes 20 and a metal film on the inner wall portion of each of the memory cell holes 20 have different film characteristics such as orientation and stress. This means that the characteristics of variable resistance layers formed thereon are also different. Therefore, a structure in which a metal film is not formed on the inner wall of each of the memory cell holes 20 has an advantage of reducing variations in characteristics of variable resistance elements and obtaining uniform characteristics.

Next, in the step illustrated in (b) of FIG. 5, the resistance thin film layer 23a on the third interlayer insulating layer 19 is removed using a CMP process. In this manner, the variable resistance layer 23 is embedded and formed in each of the memory cell holes 20 so as to be connected to the metal electrode layer 22. It should be noted that as a method of removing the resistance thin film layer 23a in this way, the etchback method may be used, other than CMP. The above process is an example of "process (E) of embedding and forming a variable resistance layer" of the present invention.

Part (a) of FIG. 6 illustrates a step of forming the fourth interlayer insulating layer 26 on the variable resistance layer 23 and the third interlayer insulating layer 19, and (b) and (c) of FIG. 6 illustrate steps of forming the upper copper lines 24 on the third interlayer insulating layer 19 so that the upper copper lines 24 are each connected to the variable resistance layer 23.

In the process illustrated in (a) to (c) of FIG. 6, in the same manner as the method of forming the lower copper lines 18, the upper copper lines 24 are formed in the fourth interlayer insulating layer 26 on the variable resistance layer 23 and the third interlayer insulating layer 19 so as to be each connected to the variable resistance layer 23. The upper copper lines 24 are formed, on the third interlayer insulating layer 19, into stripes so as to each have a shape larger than at least the width (or the diameter) of the memory cell holes 20 and three-dimensionally cross the lower copper lines 18. In the present embodiment, the same material as that for the lower copper lines 18 can be used for the upper copper lines 24. The above process is an example of "process (F) of forming plural upper lines" of the present invention.

It should be noted that when forming the upper copper lines 24, the embedded conductors 27 (illustrated in FIG. 1) connected to the upper copper lines 24 can also be formed simultaneously by filling predetermined memory cell holes with a conductive material, for instance. The upper copper lines 24 may be electrically connected to active elements (not illustrated) via the embedded conductors 27. In this manner, the variable resistance nonvolatile storage device 100 as illustrated in (a) and (b) of FIG. 1 and FIG. 2 can be manufactured.

As described above, according to the method for manufacturing the variable resistance nonvolatile storage device 100 according to the present embodiment, the opening diameter of the upper portions of the memory cell holes 20 is smaller than that of the bottom portions, and thus when forming the metal electrode layer 22 to serve as lower electrodes, the metal electrode layer 22 is deposited only on the bottom of each of the memory cell holes 20 or on the bottom and the inner wall portion in the vicinity of the bottom, thereby preventing a short circuit between the metal electrode layer (lower electrodes) 22 and the upper lines (upper electrodes) 24. This achieves the variable resistance nonvolatile storage device having a structure suitable for miniaturization and large capacity, in which the variable resistance elements 25 are embedded and formed in the memory cell holes 20.

It should be noted that the insulating film 19a is produced in order to make the opening diameter of the upper portions of the memory cell holes 20 smaller than the opening diameter of the bottom portions in the present embodiment. The insulating film 19a also improves the performance of the variable resistance elements 25 by selecting the material having an oxygen barrier property as a material included in the insulating film 19a. For example, if the insulating film 19a is formed of SiN, $Ta_2O_5$, $Nb_2O_5$, or the like, the insulating film 19a prevents oxygen included in the interlayer insulating layer 19 from diffusing into the variable resistance layer 23 (functioning as an oxygen barrier). This prevents a change in the resistance change characteristics of the variable resistance layer 23 due to the oxygen diffused from the interlayer insulating layer 19. In addition, if the plural variable resistance elements 25 each having the insulating film 19a as described above are formed, variation in the characteristics of the plural variable resistance elements 25 is reduced.

FIGS. 7 and 8 are diagrams for describing Examples 1 to 15 and Comparative Examples 1 to 9 of the variable resistance nonvolatile storage device 100 according to the present embodiment. FIG. 7 illustrates an example of a cross-sectional view of a memory cell (corresponding to (d) of FIG. 4) after process (D) of forming a metal electrode layer in the method for manufacturing the variable resistance nonvolatile storage device 100 according to the present embodiment. In the following, with regard to the memory cell hole 20, the opening diameter of the bottom portion is referred to as "hole diameter R", the opening diameter of the upper portion is referred to as "hole diameter r", and the ratio of the hole diameter r to the hole diameter R is referred to as "hole opening diameter ratio r/R" as illustrated in FIG. 7. FIG. 8 illustrates the thickness of the metal electrode layer 22 formed on the inner wall of each of the memory cell holes 20 when the metal electrode layer 22 is formed while changing the hole diameter R of the memory cell holes 20, the hole opening diameter ratio r/R of the memory cell holes 20, and a substrate bias in process (D) of forming a metal electrode layer.

Examples 1 to 15 and Comparative Examples 1 to 9 are examples in which memory cell holes are formed in process (C) of forming plural memory cell holes while the aspect ratio of the memory cell holes 20a is set to 1.3, and the diameter R of the holes is set to 100 nm, 120 nm, or 140 nm. In Examples 1 to 15, the insulating film 19a was formed by low-pressure sputtering as described above, using $SiO_2$ as a material. The process condition was that pressure applied in the deposition process was a low pressure, or specifically, 0.3 Pa. In contrast, the insulating film 19a was not formed in Comparative Examples 1 to 9. In addition, Examples 1 to 15 and Comparative Examples 1 to 9 are examples in which the metal electrode layer was formed by sputtering described above using Ti as a material, in process (D) of forming a metal electrode layer. The sputtering condition was that pressure was set to 10 Pa, and high-frequency power for substrate bias application was set to 0 W, 200 W, or 400 W.

In FIG. 8, Groups I to IX each represent a group which includes Example(s) and Comparative Example in which the same hole diameter R and the same substrate bias were used. The hole diameter R for Groups I to III is 100 nm, the hole diameter R for Groups IV to VI is 120 nm, and the hole diameter R for Groups VII to IX is 140 nm. In addition, high-frequency power (substrate bias) was 400 W for Groups I, IV, and VII, and was 200 W for Group II, V, and VIII, and no substrate bias was applied (0 W) for Groups III, VI, and IX.

As illustrated in FIG. 8, in all Groups I to IX, the thickness of the metal electrode layer 22 deposited on the inner wall of each of the memory cell holes 20 showed a tendency to decrease as the hole opening diameter ratio r/R was decreased from 1. This shows that the insulating film 19a prevents deposition of the metal electrode layer 22 on the inner wall of each of the memory cell holes 20. Therefore, if the hole opening diameter ratio r/R is less than 1, it is estimated that the effect of preventing at least deposition of the metal electrode layer 22 on the inner wall is obtained.

In addition, in FIG. 8, the diameter R of the holes was 140 nm and the hole opening diameter ratio r/R was 0.89 for all of Examples 13, 14, and 15, whereas high-frequency power was 400 W, 200 W, and 0 W therefor, respectively. If Examples 13, 14, and 15 are compared, there is a tendency that the greater high-frequency power becomes, or in other words, the greater the substrate bias becomes, the thinner the thickness of the metal electrode layer 22 on the inner wall of each of the memory cell holes 20 becomes. This shows that an increase in the substrate bias facilitates sputtered elements to advance straight ahead, and prevents deposition of the metal electrode layer 22 on the inner wall of each of the memory cell holes 20.

FIG. 9 is a graph plotted assuming that the horizontal axis represents the hole opening diameter ratio r/R in Examples 1 to 15 illustrated in FIG. 8, and the vertical axis represents the thickness of the metal electrode layer on the inner wall therein. As illustrated in FIG. 9, the hole opening diameter ratio r/R is preferably 0.82 or less, or even 0.72 or less. As illustrated in FIG. 9, it can be seen that the smaller the hole diameter R becomes, the more efficiently deposition of the metal electrode layer 22 on the inner wall is prevented. In particular, it can be seen that the thickness of the metal electrode layer 22 on the inner wall is 0 nm if the diameter R of the holes is 100 nm or less.

The above is a description of effects of the present embodiment while comparing Examples 1 to 15 and Comparative Examples 1 to 9 of the present embodiment. It should be noted that Examples 1 to 15 are examples of the present embodiment, and the present invention is not limited to these. The effects confirmed in Examples 1 to 15 depend on the shape of the memory cell holes 20 and conditions for forming the metal electrode layer 22 as described above, but do not depend on how the memory cell holes 20 are formed. Therefore, for example, it is estimated that a similar tendency will be observed also in other embodiments below. In addition, the effects confirmed in Examples 1 to 15 are not limited to be achieved using a specific electrode material, and similar effects are also achieved by using an electrode material which includes precious metal elements, for example.

[Embodiment 2]

FIG. 10 illustrates the structure of a variable resistance nonvolatile storage device 200 according to Embodiment 2 of the present invention, and is a cross-sectional view of an enlarged important part for illustrating the structure of variable resistance elements 25.

The variable resistance nonvolatile storage device 200 of the present embodiment has the same basic structure as the variable resistance nonvolatile storage device 100 according to Embodiment 1, and is different from the variable resistance nonvolatile storage device 100 according to Embodiment 1 in a structure in which an insulating film 19a is left when a metal electrode layer 29 deposited on the insulating film 19a (for example, $SiO_2$, SiN, $Ta_2O_5$, $NbO_x$, $SrO_x$, etc.) is removed by CMP or the like.

A description is given of a method for manufacturing the variable resistance nonvolatile storage device 200 according to the present embodiment, with reference to (a) to (d) of FIG. 11. The process until a third interlayer insulating layer 19 is formed on lower copper lines 18 embedded and formed in a second interlayer insulating layer 16 is the same as that in Embodiment 1 as illustrated in (a) and (b) of FIG. 3, and thus a description thereof is omitted.

Parts (a) and (b) of FIG. 11 illustrate steps of forming, at predetermined positions of the third interlayer insulating layer 19, plural memory cell holes 20 which reach the lower copper lines 18, and whose opening diameter of the upper portions is smaller than that of the bottom portions. Parts (c) and (d) of FIG. 11 illustrate steps of forming a metal electrode layer 22 on the bottom of each of the memory cell holes 20 by sputtering.

As illustrated in (a) of FIG. 11, plural memory cell holes 20a penetrating to the surfaces of the lower copper lines 18 are formed in the third interlayer insulating layer 19. In the present embodiment, the memory cell holes 20a are formed at regular spacings along the lower copper lines. The bottom opening of the memory cell holes 20a has a smaller external shape than the lower copper lines 18. It should be noted that although the external shape of the memory cell holes 20a is square in (a) in FIG. 1, the external shape may be circular, elliptic, or even other shapes. The above process is an example of "sub process (C1) of forming plural memory cell holes" according to Embodiment 2, which is included in "process (C) of forming plural memory cell holes" of the present invention.

Next, in the step illustrated in (b) of FIG. 11, the insulating film 19a is deposited in each of the memory cell holes 20a and on the third interlayer insulating layer 19. As the material of the insulating film 19a, at least one selected from the group which includes $SiO_2$, SiN, $Ta_2O_5$, $NbO_x$, and $SrO_x$ can be used, for example. Sputtering is preferable as a method for forming the film. If the diameter of the memory cell holes 20a is 100 nm or less and the aspect ratio is 1 or more, it is preferable that the mean free path is 5 µm or more by setting the pressure applied when the film is formed to 30 mTorr or lower. If the film is formed under such conditions, sputtered elements are more likely to move in random directions, and thus most of the elements do not deposit on the bottom of each of the memory cell holes 20a. As a result, this achieves the shape as illustrated in (b) of FIG. 4 (an eaves-like shaped structure obtained by forming an inverse tapered portion on the upper inner wall of each of the memory cell holes 20a). Further, the sputtered elements are attracted due to the potential difference between plasma and the substrate, and if this energy is high, the sputtered elements tend to advance straight ahead, and become more likely to deposit on the bottom portion of each of the memory cell holes 20a. Accordingly, it is preferable that the potential difference between plasma and the substrate is 30 V or lower in order to obtain the shape as illustrated in (b) of FIG. 4. The above process is an example of "sub process (C2) of depositing an insulating film" according to Embodiment 2, which is include in "process (C) of forming plural memory cell holes" of the present invention. It should be noted that if a layer is slightly deposited on the bottom of each of the memory cell holes 20a, that layer can be removed by etch back.

In addition, as another method for the above sub process (C2), the insulating film 19a can be deposited by using "oblique sputtering" of depositing sputtered elements while rotating a substrate wafer after the centers of a sputtering target and the substrate wafer are displaced. In this case, the elements sputtered from the target do not enter the memory cell holes 20a toward the bottoms, but rather toward the inner wall of each of the memory cell holes 20a. Thus, the elements tend not to deposit on the bottom of each of the memory cell holes 20a, which achieves the shape as illustrated in (b) of FIG. 11.

Next, in the step illustrated in (c) of FIG. 11, the metal electrode layers 29 and 22 are formed by sputtering on the insulating film 19a and on the lower lines 18 exposed from the bottoms of the memory cell holes 20, respectively. Sputtering at this time is performed to form the layer under the conditions that the tendency of film forming elements to advance straight ahead is increased so that the elements are deposited on the bottoms of the memory cell holes 20a. Accordingly, the pressure applied when the layers are formed is 30 mTorr or higher, thereby decreasing the tendency of sputtered elements to move in random directions, and causing the sputtered elements to float. A substrate bias is applied in this state, and sputtered elements are attracted to the bottoms of the memory cell holes 20a, thereby achieving deposition thereof on the bottoms of the memory cell holes 20a. Specifically, it is preferable to apply a bias to the substrate and cause the potential difference between plasma and the substrate to be 30 V or higher.

The metal electrode layer 22 may comprise material which includes metal elements. However, preferably, the material includes precious metal elements to exhibit favorable resistance change characteristics. For example, the material preferably comprises one of platinum metals selected from among gold (Au), silver (Ag), platinum (Pt), palladium (Pd), iridium (Ir), and ruthenium (Ru) (i.e., at least one metal selected from a group which includes the metals).

Next, in the step illustrated in (d) of FIG. 11, the metal electrode layer 29 deposited on the insulating film 19a is removed by a CMP process. At this time, a process in which etching is stopped by the insulating film 19a having a high polishing rate is also advantageous for the control of variations in the in-plane thickness by CMP. The above process is an example of "process (D) of forming a metal electrode layer" of the present invention.

It should be noted that "process (E) of embedding and forming a variable resistance layer" in which a resistance thin film layer 23a to be a variable resistance layer 23 is embedded and formed in each of the memory cell holes 20 and on the third interlayer insulating layer 19 is the same as that in Embodiment 1 as illustrated in (a) and (b) of FIG. 5, and thus a description thereof is omitted. Furthermore, the process of forming a fourth interlayer insulating layer 26 on the variable resistance layer 23 and the third interlayer insulating layer 19, and "process (F) of forming plural upper lines" in which upper copper lines 24 are formed on the third interlayer insulating layer 19 so as to be each connected to the variable resistance layer 23 are the same as those in Embodiment 1 as illustrated in (a) to (c) of FIG. 6, and thus a description thereof is omitted.

As described above, according to the method for manufacturing the variable resistance nonvolatile storage device 200 according to the present embodiment, the opening diameter of the upper portions of the memory cell holes 20 is smaller than that of the bottom portions, and thus when forming the metal electrode layer 22 which is to serve as lower electrodes, the metal electrode layer 22 is deposited only on the bottom of each of the memory cell holes 20 or on the bottom and the inner wall portion in the vicinity of the bottom, thereby preventing a short circuit between the metal electrode layer (lower electrodes) 22 and the upper lines (upper electrodes) 24. This achieves the variable resistance nonvolatile storage device having a structure suitable for miniaturization and large capacity, in which the variable resistance elements 25 are embedded and formed in the memory cell holes 20.

[Embodiment 3]

Parts (a) and (b) of FIG. 12 illustrate a structure of a variable resistance nonvolatile storage device 300 according to Embodiment 3 of the present invention. Part (a) of FIG. 12 is a plan view, and (b) of FIG. 12 is a cross-sectional view taken along line 1A-1A illustrated in (a) of FIG. 12, and showing the variable resistance nonvolatile storage device 300 viewed in the arrow direction. In addition, FIG. 13 is a cross-sectional view of an enlarged important part for illustrating the structure of variable resistance elements 25.

Although the variable resistance nonvolatile storage device 300 according to the present embodiment has the same basic structure as that of the variable resistance nonvolatile storage device 100 according to Embodiment 1, the variable resistance nonvolatile storage device 300 has a stack structure in which a fifth interlayer insulating layer 19b which includes a silicon nitride film is deposited on a third interlayer insulating layer 19 which includes a silicon oxide film. In other words, the third interlayer insulating layer 19 in Embodiment 1 corresponds to a layer obtained by combining the third interlayer insulating layer 19 and the fifth interlayer insulating layer 19b in Embodiment 3. Memory cell holes penetrating to the surfaces of lower lines 18 are formed in the stacked two insulating layers. The difference from the variable resistance nonvolatile storage device 100 according to Embodiment 1 is that the opening diameter of portions of memory cell holes 20 penetrating the fifth interlayer insulating layer is smaller than the opening diameter of the bottom portions that are portions penetrating the third interlayer insulating layer. It should be noted that the third interlayer insulating layer 19 in the present embodiment is an example of a "lower interlayer insulating layer" according to the present invention, and the fifth interlayer insulating layer 19b is an example of an "upper interlayer insulating layer" according to the present invention.

A description is given of a method for manufacturing the variable resistance nonvolatile storage device 300 according to the present embodiment, with reference to (a) to (c) of FIG. 14 and (a) and (b) of FIG. 15. The process until the third interlayer insulating layer 19 is formed on lower copper lines 18 embedded and formed in the second interlayer insulating layer 16 is the same as that in Embodiment 1 as illustrated in (a) and (b) of FIG. 3, and thus a description thereof is omitted.

It should be noted that (a) to (c) of FIG. 14 and (a) and (b) of FIG. 15 illustrate a structure which includes only the second interlayer insulating layer 16 having therein the lower copper lines 18 and elements on and above the layer, to simplify the drawings.

Parts (a) to (c) of FIG. 14 illustrate a process of depositing the fifth interlayer insulating layer 19b (interlayer insulating layer formed using SiN) on the third interlayer insulating layer 19, forming plural memory cell holes 20a penetrating to the lower copper lines 18 at predetermined positions of the fifth interlayer insulating layer 19b, and forming, by etching using diluted hydrofluoric acid, the memory cell holes 20a whose bottom portions in the third interlayer insulating layer 19 have an opening diameter larger than that in the fifth interlayer insulating layer 19b.

In (a) of FIG. 14, the fifth interlayer insulating layer 19b is deposited on the third interlayer insulating layer 19. The SiN film may be formed by sputtering or CVD. The process of forming the third interlayer insulating layer 19 and the fifth interlayer insulating layer 19b as described above is an example of "process (B) of forming an interlayer insulating layer" of the present invention.

Next, in the step illustrated in (b) of FIG. 14, the plural memory cell holes 20a penetrating to the surfaces of the lower copper lines 18 are formed in the fifth interlayer insulating layer 19b. In the present embodiment, the memory cell holes 20a are formed at regular spacings along the lower copper lines. The memory cell holes 20a have a smaller external shape than the lower copper lines 18. It should be noted that although the external shape of the memory cell holes 20a is square in (a) in FIG. 1, the external shape may be circular, elliptic, or even other shapes. The above process is an example of "sub process (C3) of forming plural memory cell holes" according to Embodiment 3, which is included in "process (C) of forming plural memory cell holes" of the present invention.

Next, the step illustrated in (c) of FIG. 14 is a step of increasing the diameter of portions of the memory cell holes penetrating the third interlayer insulating layer 19 by wet etching so that the opening diameter of portions of the memory cell holes 20a penetrating the fifth interlayer insulating layer 19b is smaller than the opening diameter of portions of the memory cell holes 20a penetrating the third interlayer insulating layer 19. For example, if diluted hydrofluoric acid is used as an etching chemical in the wet etching, the fifth interlayer insulating layer 19b comprises SiN and thus is not etched. However, the portions of the memory cell holes in the third interlayer insulating layer 19 comprise SiO, and thus are etched with diluted hydrofluoric acid, thereby obtaining the shape of the memory cells as described above. The above wet etching process is an example of "sub process (C4) of increasing a diameter" according to Embodiment 3, which is included in "process (C) of forming plural memory cell holes" of the present invention. This process has a feature that control of the ratio of the diameter of the portions in the third interlayer insulating layer 19 to the opening diameter of the memory cell holes penetrating the fifth interlayer insulating layer 19b having an eaves-like shape is comparatively easy. However, Embodiment 1 of the present invention has merits that the known technique is used as it is to form openings of memory cell holes 20, and forming the reverse tapered shape is controllable simply based on the sputtering conditions for an insulating film 19a.

Next, in the step illustrated in (a) of FIG. 15, a metal electrode layer 22 is formed by sputtering through the fifth interlayer insulating layer 19b. Sputtering is performed to form the layer under the conditions that the tendency of film forming elements to advance straight ahead is increased and the elements are deposited on the bottoms of the memory cell holes 20a. Thus, preferably, the pressure applied when the layer is formed is 30 mTorr or lower, and a substrate bias is applied in order to increase the tendency of the elements to advance straight ahead. Specifically, it is preferable to apply a bias to the substrate and cause the potential difference between plasma and the substrate to be 30 V or greater.

The metal electrode layer 22 may comprise material which includes metal elements. However, the material preferably includes precious metal elements in order for the layer to exhibit favorable resistance change characteristics. For example, the material preferably comprises one of platinum metals selected from among gold (Au), silver (Ag), platinum (Pt), palladium (Pd), iridium (Ir), and ruthenium (Ru) (i.e., at least one metal selected from a group which includes these metals).

The processes up to when a variable resistance layer 23 is embedded and formed after forming the metal electrode layer 22 on the bottom of each of the memory cell holes 20a ("process (D) of forming a metal electrode layer", and "process (E) of embedding and forming a variable resistance layer") are the same as that in Embodiment 1 as illustrated in (a) and (b) of FIG. 5, and thus a description thereof is omitted.

Furthermore, "process (F) of forming plural upper lines" in which a fourth interlayer insulating layer 26 is formed on the variable resistance layer 23 and the fifth interlayer insulating layer 19b which includes a silicon nitride film, and upper copper lines 24 are formed on the fifth interlayer insulating layer 19b so as to be each connected to the variable resistance layer 23 is also the same as that in Embodiment 1 as illustrated in (a) to (c) of FIG. 6, and thus a description thereof is omitted.

In this manner, the variable resistance nonvolatile storage device 300 as illustrated in (a) and (b) of FIG. 12 and FIG. 13 can be manufactured.

As described above, according to the method for manufacturing the variable resistance nonvolatile storage device 300 according to the present embodiment, the opening diameter of the upper portions of the memory cell holes 20 in the upper interlayer insulating layer is smaller than the opening diameter of the bottom portions of the memory cell holes 20. Thus, when forming the metal electrode layer 22 which is to serve as lower electrodes, the metal electrode layer 22 is deposited only on the bottoms of the memory cell holes 20 or the bottoms and the inner wall portions in the vicinity of the bottoms, thereby preventing a short circuit between the metal electrode layer (lower electrodes) 22 and the upper lines (upper electrodes) 24. This achieves the variable resistance nonvolatile storage device having a structure suitable for miniaturization and large capacity, in which the variable resistance elements 25 are embedded and formed in the memory cell holes 20.

[Embodiment 4]

FIG. 16 illustrates the structure of a variable resistance nonvolatile storage device 400 according to Embodiment 4 of the present invention, and is a cross-sectional view of an enlarged important part for illustrating the structure of variable resistance elements 25. The variable resistance nonvolatile storage device 400 illustrated in FIG. 16 is different from the variable resistance nonvolatile storage device 200 according to Embodiment 2 in that a variable resistance layer 23 has a stack structure which includes a first variable resistance layer 231 and a second variable resistance layer 232. In the present embodiment, the variable resistance layer 23 embedded and formed in each of the memory cell holes has a stack structure which includes the first variable resistance layer 231 formed so as to be connected to a metal electrode layer 22, and the second variable resistance layer 232 formed on the first variable resistance layer 231. The first variable resistance layer 231 and the second variable resistance layer 232 comprise the same type of metal oxide, and the oxygen content percentage of the first variable resistance layer 231 is higher than the oxygen content percentage of the second variable resistance layer 232. It should be noted that the structure of the variable resistance layer 23 can also be changed to a similar structure in the variable resistance nonvolatile storage device 100 according to Embodiment 1 and the variable resistance nonvolatile storage device 300 according to Embodiment 3.

Resistance change operation is caused by the oxidation reduction reaction in the vicinity of electrodes of the variable resistance layer 23. In the variable resistance nonvolatile storage device 400, the first variable resistance layer 231 having the higher oxygen content percentage and connected to the metal electrode layer 22 is disposed on the bottom side of the memory cell holes 20, and the second variable resistance layer 232 having the lower oxygen content percentage is disposed thereon. In other words, the first variable resistance layer 231 having the higher content percentage of oxygen which can be contributed to oxidation reduction is disposed at an interface portion between the variable resistance layer 23 and the metal electrode layer 22. Accordingly, a resistance change can be reliably caused in the interfacial region between the first variable resistance layer 231 and the metal electrode layer 22. As a result, the polarity of an electrical pulse to be applied to cause the resistance change (high resistance or low resistance) of the variable resistance layer 23 is uniquely determined, thereby obtaining stable operating characteristics as a storage device. In addition, when forming the first variable resistance layer 231 having the higher oxygen content percentage and the second variable resistance layer 232 having the lower oxygen content percentage, the resistance change layers are not exposed to fluorine gas or fluorine plasma which deteriorates the resistance change characteristics of the resistance change layers, and thus deterioration of the variable resistance layers is prevented. It should be noted that in FIG. 16, although the first variable resistance layer 231 is also formed on the inner wall of each of the memory cell holes 20, the first variable resistance layer 231 may be formed at least on a portion in contact with the metal electrode layer 22 (bottoms of the memory cell holes 20).

Next is a description of a manufacturing method according to the present embodiment, with reference to (a) to (d) of FIG. 17. It should be noted that (a) to (d) of FIG. 17 illustrate a structure which includes only a second interlayer insulating layer 16 and elements on and above the layer, to simplify the drawings. In addition, the following is a detailed description of "process (E) of embedding and forming a variable resistance layer" in the manufacturing method according to the present embodiment. Other processes are the same as various processes according to Embodiments 1 to 3, and thus a description thereof is omitted. Therefore, as illustrated in (a) of FIG. 17, the following is a description of a process after forming the metal electrode layer 22 only on the bottoms of the memory cell holes 20 in the third interlayer insulating layer 19 by sputtering, using the manufacturing method described in relation to the variable resistance nonvolatile storage device 100 according to Embodiment 1 of the present invention.

First, as illustrated in (b) of FIG. 17, a first resistance thin film layer 231a to be the first variable resistance layer 231 is formed in each of the memory cell holes 20 and on the third interlayer insulating layer 19. Also in the present embodiment, since an oxygen-deficient tantalum oxide ($TaO_x$) is used for the variable resistance layer, a reactive sputtering method for sputtering a tantalum target in oxygen gas atmosphere is used to form the first resistance thin film layer 231a. Preferably, the oxygen content percentage thereof is 65 to 75 atm %, the resistivity is 107 mΩcm or more, and the thickness is 3 to 10 nm. If reactive sputtering is used, the thickness of the first variable resistance layer formed on the inner wall portion is thinner than on the bottom of each of the memory cell holes 20; however, the first variable resistance layer may be formed at least on the bottom of each of the memory cell holes 20. Here, an example is described in which the first variable resistance layer having a high oxygen concentration is formed using reactive sputtering. However, a transition metal thin film layer or a resistance thin film layer having a low oxygen concentration may be formed, and thereafter the entire layer may be oxidized by plasma oxidation processing or the like, and a transition metal oxide layer having a high oxygen concentration may be formed. With a sputtering process, it is difficult to allow an oxygen content to be greater than or equal to the content indicated by stoichiometry. If plasma oxidation processing is performed, oxygen is injected into the grain boundary of tantalum oxides, a defect thereof, and the like, thereby forming a transition metal oxide layer having a higher oxygen content percentage. Thus, this is effective in the control of leak current. Further, a reactive sputtering method may be used in which a tantalum oxide target is sputtered in oxygen gas atmosphere.

In addition, CVD and atomic layer deposition (ALD) can also be used in order to form the first variable resistance layer 231 in each of the memory cell holes 20. If ALD is used in particular, as illustrated in (b) of FIG. 17, the first conformal variable resistance layer can also be formed on the inner wall portion of each of the memory cell holes 20.

In addition, as another formation method, a tantalum thin film may be formed previously, and this tantalum thin film layer may be oxidized in oxygen environment (400 to 450° C.), thereby forming the first variable resistance layer 231 which comprises a tantalum oxide. At this time, tantalum completely oxidizes, and thus the oxygen content percentage thereof will be about 71.4 atm %, which is close to the stoichiometry of $Ta_2O_5$. It should be noted that it is preferable to use efficient thermal oxidation in order to completely oxidize metal to obtain a metal oxide in this process.

A metal film on the bottom of each of the memory cell holes 20 and a metal film on the inner wall portion of each of the memory cell holes 20 have different film characteristics such as orientation and stress. This means that the characteristics of variable resistance layers formed thereon are also different. In particular, in the present embodiment, the variable resistance layer (the first variable resistance layer 231) which has a high oxygen concentration and determines primary features of resistance change characteristics is disposed on the metal electrode layer 22. Therefore, a structure in which a metal film is not formed on the inner wall of each of the memory cell holes 20 has an advantage in reducing variation of characteristics of the variable resistance elements and obtaining uniform characteristics thereof.

Next, as illustrated in (c) of FIG. 17, a second resistance thin film layer 232a which has a lower oxygen content percentage than the first resistance thin film layer 231a, and is to be the second variable resistance layer 232 is formed on the first resistance thin film layer 231a in a stacked manner. As in the case of the first resistance thin film layer 231a, the second resistance thin film layer 232a is also formed by obtaining an oxygen-deficient tantalum oxide by a reactive sputtering method, until the memory cell holes 20 are completely filled. The oxygen content percentage thereof is 50 to 65 atm %, and the resistivity thereof is 2 to 50 mΩcm.

Next, as illustrated in (d) of FIG. 17, the first resistance thin film layer 231a and the second resistance thin film layer 232a on and above the third interlayer insulating layer 19 are removed by using a CMP process. Through the above process, the variable resistance layer 23 having a stack structure which includes the first variable resistance layer 231 connected to the metal electrode layer 22 and the second variable resistance layer 232 can be embedded and formed in each of the memory cell holes 20. It should be noted that an etchback method may be used as a method of removing the resistance thin film layers, other than CMP.

After that, as with the manufacturing methods according to other embodiments of the present invention, a fourth interlayer insulating layer 26 is formed on the variable resistance layer 23 and the third interlayer insulating layer 19, and upper copper lines 24 are formed in the fourth interlayer insulating layer 26 so as to be each connected to the variable resistance layer 23, thereby manufacturing the variable resistance nonvolatile storage device 400 according to the present embodiment.

As described above, according to the method for manufacturing the variable resistance nonvolatile storage device 400 according to the present embodiment, the opening diameter of the upper portions of the memory cell holes 20 is smaller than the opening diameter of the bottom portions, and thus when forming the metal electrode layer 22 which is to serve as lower electrodes, the metal electrode layer 22 is deposited only on the bottom of each of the memory cell holes 20 or the bottom and the inner wall portion in the vicinity of the bottom, thereby preventing a short circuit between the metal electrode layer (lower electrodes) 22 and the upper lines (upper electrodes) 24. Furthermore, the first variable resistance layer 231 having a high oxygen concentration and the second variable resistance layer 232 having a low oxygen concentration are formed on and above the metal electrode layer 22 in this stated order, which allows the resistance change characteristics to be stably exhibited. This achieves the variable resistance nonvolatile storage device having a structure suitable for miniaturization and large capacity, in which the variable resistance elements 25 are embedded and formed in the memory cell holes 20.

[Embodiment 5]

Parts (a) and (b) of FIG. 18 illustrate a structure of a variable resistance nonvolatile storage device 500 according to Embodiment 5 of the present invention. Part (a) of FIG. 18 is a cross-sectional view, and (b) of FIG. 18 is a cross-sectional view of an enlarged important part for illustrating the structure of variable resistance elements 25 and diode elements 33.

The variable resistance nonvolatile storage device 500 according to the present embodiment has a basic structure similar to that of the variable resistance nonvolatile storage device 100 according to Embodiment 1, and is different from the variable resistance nonvolatile storage device 100 according to Embodiment 1 in that the diode elements 33 connected to the variable resistance elements 25 in series are included.

Specifically, a metal electrode layer 22, a variable resistance layer 23, and an intermediate electrode layer 30 are formed, in a sequentially stacked manner, in memory cell holes 20 formed on lower lines 18, thereby forming the variable resistance elements 25.

The same material as that of the metal electrode layer 22 in Embodiment 1 is used for the metal electrode layer 22. The same material as that of the variable resistance layer 23 in Embodiment 1 or 4 is used for the variable resistance layer 23.

Here, the diode elements 33 are metal-semiconductor-metal (MSM) diodes. MSM diodes have a characteristic of allowing or not allowing a current to flow bidirectionally (on both the positive voltage side and the negative voltage side), and a characteristic of allowing a large current necessary when the resistance changes. Various conductive materials can be used for the intermediate electrode layer 30 included in each of the diode elements 33. It is preferable to use TaN, TiN, or W for the intermediate electrode layer 30, for example. This is because these materials function as lower electrodes of the diode elements 33, and also satisfy the conditions required as the electrode material for variable resistance elements. In addition, there is little deterioration of the diode characteristics when a large current is outputted.

Line trenches 28 are formed in a fourth interlayer insulating layer 26 formed on a third interlayer insulating layer 19, and a semiconductor layer 31, an upper electrode 32, and an upper line 24 are embedded and formed in each of the line trenches 28 in a sequentially stacked manner. Then, the intermediate electrode layer 30, the semiconductor layer 31, and the upper electrodes 32 constitute MSM diodes which are examples of the diode elements 33.

As the diode element 33, in addition to an MSM diode having a three-layered stack structure which includes the semiconductor layer 31, and the intermediate electrode layer 30 and the upper electrode 32 between which the semiconductor layer 31 is interposed as described above, an element having a nonlinear switching characteristic can be used according to the resistance change characteristics of the variable resistance elements 25, such as a metal-insulator-metal (MIM) diode having a three-layered stack structure which includes an insulating layer and a pair of metal electrode body layers between which the insulating layer is interposed, a pn junction diode having a two-layered stack structure which includes a p-type semiconductor and an n-type semiconductor, or a Schottky diode having a two-layered stack structure which includes a semiconductor layer and a metal-electrode body layer.

In the variable resistance nonvolatile storage device 500, the variable resistance elements 25 and the diode elements 33 are connected in series and formed at cross-points at which the lower lines 18 (e.g., bit lines) and the upper lines 24 (e.g., word lines) are three-dimensionally crossing. This structure allows reduction in crosstalk which occurs when reading or writing a resistance value of the variable resistance layer 23.

Next is a description of a method for manufacturing the variable resistance nonvolatile storage device 500 according to the present embodiment, with reference to (a) to (c) of FIG. 19, (a) to (c) of FIG. 20, and (a) and (b) of FIG. 21. It should be noted that (a) to (c) of FIG. 19, (a) to (c) of FIG. 20, and (a) and (b) of FIG. 21 illustrate a structure which includes only a second interlayer insulating layer 16 having therein lower copper lines 18 and elements on and above the layer, to simplify the drawings. The following is a detailed description of "process (G) of forming diodes" in the manufacturing method according to the present embodiment, and a description of other processes is omitted. Therefore, the following is a description of a process after embedding and forming, in each of memory cell holes 20, the variable resistance layer 23 connected to the metal electrode layer 22 by using the manufacturing method described in relation to the variable resistance nonvolatile storage device 100 according to Embodiment 1 of the present invention, as illustrated in (a) of FIG. 19.

Part (b) of FIG. 19 illustrates a step of forming depressed portions 30b on the surface side of the variable resistance layer 23 embedded and formed in each of the memory cell holes 20, and (c) of FIG. 19 illustrates a step of forming, in each of the depressed portions, a metal thin film layer 30a that is to be the intermediate electrode layer 30 which functions as lower electrodes of the diode elements 33.

First, as illustrated in (b) of FIG. 19, over polish is performed when the variable resistance layer 23 is embedded and formed in each of the memory cell holes 20 by CMP, thereby forming the depressed portions 30b. Specifically, utilizing the difference in the polishing rate between the variable resistance layer 23 and the third interlayer insulating layer 19, only a portion on the surface side of the variable resistance layer 23 in each of the memory cell holes 20 is removed, thereby forming the depressed portions 30b. At this time, a portion of an insulating film 19a in the vicinity of the opening may be removed, which is not illustrated. It should be noted that other than CMP, etchback may be used as a method of removing a portion of the variable resistance layer 23 in such a manner.

In the step illustrated in (c) of FIG. 19, a metal thin film layer 30a to be the intermediate electrode layer 30 which functions as upper electrodes of the variable resistance elements 25 and functions as lower electrodes of the diode elements 33 is formed in each of the depressed portions 30b in the memory cell holes 20 and on the third interlayer insulating layer 19. In the present embodiment, a film which comprises tantalum nitride (TaN), titanium nitride (TiN), or tungsten (W) can be formed by sputtering, as the metal thin film layer 30a.

Part (a) of FIG. 20 illustrates a step of removing the metal thin film layer 30a on the third interlayer insulating layer 19, (b) of FIG. 20 illustrates a step of forming the fourth interlayer insulating layer 26 on the intermediate electrode layer 30 disposed as the upper layer in each of the memory cell holes 20, and (c) of FIG. 20 illustrates a step of forming, in the fourth interlayer insulating layer 26, the line trenches 28 for embedding and forming the diode elements 33 which are to be each connected to the intermediate electrode layer 30.

As illustrated in (a) of FIG. 20, the metal thin film layer 30a on the third interlayer insulating layer 19 is removed using a CMP process, and the intermediate electrode layer 30 is embedded and formed in each of the memory cell holes 20.

Next, as illustrated in (b) of FIG. 20, the fourth interlayer insulating layer 26 is further formed, by using CVD or the like, on the intermediate electrode layer 30 and the third interlayer insulating layer 19.

Next, in the step illustrated in (c) of FIG. 20, the line trenches 28 for embedding and forming the semiconductor layer 31 and the upper electrodes 32 which are to serve as parts of the diode elements 33, and the upper copper lines 24 are formed in the fourth interlayer insulating layer 26. The line trenches 28 are formed into stripes and three-dimensionally cross the lower copper lines 18 in the present embodiment. Accordingly, in the steps to be described below, the semiconductor layer 31, the upper electrodes 32, and the upper copper lines 24 are formed into stripes which cross the lower copper lines 18. In addition, the line trenches 28 can be formed with ease by technique used for a general semiconductor process.

Parts (a) and (b) of FIG. 21 illustrate steps of embedding and forming, in the line trenches 28 formed in the fourth interlayer insulating layer 26, the semiconductor layer 31 and the upper electrodes 32 which are to serve as parts of the diode elements 33 and the upper copper lines 24.

In the step illustrated in (a) of FIG. 21, in the line trenches 28 and on the fourth interlayer insulating layer 26, a semiconductor thin film layer 31a to be the semiconductor layer 31 of the diode elements 33 and a metal thin film layer 32a to be the upper electrodes 32 are formed in a stacked manner. Then, a copper thin film layer 24a to be the upper copper lines 24 is further formed.

In the present embodiment, nitrogen-deficient silicon nitride (SiNy) can be used as a material of the semiconductor layer 31, and tantalum nitride, titanium nitride, or tungsten can be used as a material of the upper electrodes 32. Accordingly, MSM diodes can be each formed by the semiconductor layer 31, and the intermediate electrode layer 30 and the upper electrode 32 between which the semiconductor layer 31 is interposed. It should be noted that the SiNy film having such a semiconductor characteristic can be formed by reactive sputtering using a Si target in nitrogen gas atmosphere, for example. Specifically, the SiNy film may be produced under room temperature conditions, while the pressure of a chamber is set to 0.1 Pa to 1 Pa, and the rate of N2 flow to Ar flow may be adjusted.

In the case where the SiNy film having a semiconductor characteristic (y=0.3) is produced under the above conditions so as to have a thickness of 10 nm, a current density of $5 \times 10^4$ A/cm$^2$ is obtained by the voltage application of 2.0 V, whereas a current density of $1 \times 10^3$ A/cm$^2$ is obtained by the voltage application of 1.0 V. Therefore, it can be seen that an ON/OFF ratio is 50 when these voltages are used as reference voltages, and thus the SiNy film can be used sufficiently for the diode elements of the variable resistance nonvolatile storage device.

The same structure as that of the lower copper lines 18 can be used for the upper copper lines 24.

Next, in the step illustrated in (b) of FIG. 21, the semiconductor thin film layer 31a, the metal thin film layer 32a, and the copper thin film layer 24a on and above the fourth interlayer insulating layer 26 are removed by CMP, thereby obtaining the semiconductor layer 31 and the upper electrodes 32 included in the diode elements 33 and the upper copper lines 24 embedded and formed in the line trenches 28. The upper copper lines 24 are electrically connected to the variable resistance layer 23 via the upper electrodes 32, the semiconductor layer 31, and the intermediate electrode layer 30.

The above process achieves the variable resistance elements 25 each including the metal electrode layer 22, the variable resistance layer 23, and the intermediate electrode layer 30, and the diode elements 33 each including the intermediate electrode layer 30, the semiconductor layer 31, and one of the upper electrodes 32. Accordingly, the variable resistance nonvolatile storage device 500 can be produced by the manufacturing method according to the present embodiment.

It should be noted that the present embodiment describes an example in which the intermediate electrode layer 30 is formed on the variable resistance layer 23 in each of the memory cell holes 20 in order to form lower electrodes most suitable for diodes, the semiconductor layer 31 may be directly formed on the variable resistance layer 23 depending on a combination of the material of the variable resistance layer 23 and the material of the semiconductor layer 31.

In addition, although an MSM diode is used as the diode element 33 in the present embodiment, as another example, an MIM diode having a three-layered stack structure which includes an insulating layer and metal electrode body layers between which the insulating layer is interposed, a pn junction diode having a two-layered stack structure which includes a p-type semiconductor layer and an n-type semiconductor layer, or a Schottky diode having a two-layered stack structure which includes a semiconductor layer and a metal-electrode body layer may be formed.

Furthermore, although a description of the lines is given using copper lines embedded and formed, aluminum lines formed by patterning may be used. At that time, when forming upper lines, the semiconductor thin film layer 31a, the metal thin film layer 32a, and the aluminum layer are formed sequentially, and thereafter the upper lines are formed by patterning.

[Embodiment 6]

A variable resistance nonvolatile storage device according to Embodiment 6 of the present invention uses a structure of the variable resistance nonvolatile storage device 500 according to Embodiment 5 illustrated in (a) of FIG. 18 as a basic structure, and includes one or more stacked layers each formed of a structural unit which includes a lower line layer, variable resistance elements, diode elements, and upper lines. By stacking such layers, the variable resistance nonvolatile storage device having a still larger capacity can be obtained.

FIG. 22 is a cross-sectional view illustrating the structure of a variable resistance nonvolatile storage device 600 according to the present embodiment. The following is a description of the structure of the variable resistance nonvolatile storage device 600 according to the present embodiment. The variable resistance nonvolatile storage device 600 illustrated in FIG. 22 includes two more stacked layers each formed of the structural unit on the basic structure. Accordingly, three layers each formed of the structural unit which includes the variable resistance elements and the diode elements are stacked. In the following, in order to facilitate the understanding of the respective structures of the first, second, and third layers, the term "first" is added at the beginning of the names of constituent elements included in the first layer, "second" is added at the beginning of the names of constituent elements included in the second layer, and "third" is added at the beginning of the names of constituent elements included in the third layer, thereby distinguishing constituent elements in the respective layers in the description.

In order to form constituent elements in the second layer, an interlayer insulating layer 41 is further formed on first upper lines 24 and a fourth interlayer insulating layer 26, which are constituent elements in the first layer. In the interlayer insulating layer 41, memory cell holes 202 are provided at positions corresponding to first variable resistance elements 25, and second variable resistance elements 45 are embedded and formed in the memory cell holes 202. The second variable resistance elements 45 each include a second metal electrode layer 42, a second variable resistance layer 43, and an intermediate electrode 44 which functions as the upper electrode of the second variable resistance element 45 and also as a lower electrode of the second diode element 48. Then, an interlayer insulating layer 49 which includes line trenches for embedding and forming second upper lines 50 is formed on the intermediate electrodes 44 and the interlayer insulating layer 41. A second semiconductor layer 46 connected to the second intermediate electrodes 44 and forming second diode elements 48, second upper electrodes 47, and the second upper lines 50 are embedded and formed in the line trenches in the interlayer insulating layer 49. The second semiconductor layer 46, the second upper electrodes 47, and the second upper lines 50 are formed into stripes and three-dimensionally cross the first upper lines 24. The second diode elements 48 each include one of the second intermediate electrodes 44, the second semiconductor layer 46, and one of the second upper electrodes 47.

Next, in order to form constituent elements in the third layer, an interlayer insulating layer 52 is formed on the second upper lines 50 and the interlayer insulating layer 49. Memory cell holes 203 are provided in the interlayer insulating layer 52 at positions corresponding to the first variable resistance elements 25 and the second variable resistance element 45, and third variable resistance elements 56 are embedded and formed in the memory cell holes 203. The third variable resistance elements 56 each include a third metal electrode layer 53, a third variable resistance layer 54, and one of third intermediate electrodes 55. An interlayer insulating layer 60 is formed on the third intermediate electrodes 55 and the interlayer insulating layer 52. A third semiconductor layer 57 connected to each of third intermediate electrodes 55 and included in each of third diode elements 59, third upper electrodes 58, and third upper lines 61 are embedded and formed in the interlayer insulating layer 60. The third semiconductor layer 57, the third upper electrodes 58, and the third upper lines 61 are formed into stripes and three-dimensionally cross the second upper lines. The third diode elements 59 each include one of the third intermediate electrodes 55, the third semiconductor layer 57, and one of the third upper electrodes 58.

In addition, in each stacked layer formed of the structural unit on or above the basic structure, the upper lines in a layer positioned under the stacked layer and formed of the structural unit (the first upper lines 24, the second upper lines 50) also serve as the lower lines in the stacked layer formed of the structural unit (the second lower lines, the third lower lines).

Lower lines 18 are connected to source areas 12a of active elements 12 via embedded conductors 14 and 17 and circuit lines 15. In addition, the first upper lines 24 are also connected to other active elements (not illustrated) via embedded conductors (not illustrated) and circuit lines (not illustrated) similarly. Furthermore, the second upper lines 50 are connected to the source areas 12a of other active elements 12 via the embedded conductors 14 and 17, embedded conductors 40 and 51, and the circuit lines 15 as illustrated in FIG. 22. In addition, the third upper lines 61 are also connected to other active elements (not illustrated) via embedded conductors (not illustrated) and circuit lines (not illustrated) in the same manner as the first upper lines 24.

The lower lines 18 in the first layer or the first upper lines 24 in the first layer are bit lines, and the other lines are word lines, and the first upper lines 24 or the second upper lines 50 are bit lines, and the other lines are word lines, in the same manner. It should be noted that the design is made such that if the first upper lines 24 are bit lines in the first layer, the first upper lines 24 are also bit lines in the second layer, and the second upper lines 50 are word lines. Furthermore, the design is made such that if the second upper lines 50 are word lines, the third upper lines 61 are bit lines.

As described above, in the case of the variable resistance nonvolatile storage device 600 according to the present embodiment, the diode elements 33, 48, and 59 are deposed with respect to the variable resistance elements 25, 45, and 56 provided in the layers, respectively. Accordingly, the writing to and reading from the variable resistance elements 25, 45, and 56 provided in the respective layers can be stably and reliably performed.

The variable resistance nonvolatile storage device 600 having variable resistance elements and diode elements disposed in two or more multiple layers as described above may be manufactured by basically repeating the process of manufacturing the variable resistance nonvolatile storage device 500 described in Embodiment 5.

Although the above is a description of Embodiments 1 to 6, various changes based on combinations thereof are also possible as a variable resistance nonvolatile storage device and a method for manufacturing the same according to the present invention. For example, the variable resistance nonvolatile storage device 100 according to Embodiment 1 may also have the variable resistance layer having a stack structure which includes two layers having different oxygen content percentages, as the variable resistance nonvolatile storage device 400 according to Embodiment 4.

In addition, the variable resistance nonvolatile storage device 300 according to Embodiment 3 may have a structure in which diode elements are connected to variable resistance elements in series as that of the variable resistance nonvolatile storage device 400 according to Embodiment 4, and furthermore may have a stack structure which includes variable resistance elements and diode elements as one basic structure, as the variable resistance nonvolatile storage device 600 according to Embodiment 6.

INDUSTRIAL APPLICABILITY

The variable resistance nonvolatile storage device according to the present invention has a cross-point structure which allows miniaturization and large capacity, and also has a memory cell structure which has been difficult to be achieved using conventional manufacturing methods, and thus is useful in various electronic device fields in which a nonvolatile storage device is used.

REFERENCE SIGNS LIST

1 Bit line
2 Variable resistance layer
3 Intermediate electrode layer
4 Diode layer
5 Word line
6 Variable resistance element
7 Diode element
8 Interlayer insulating layer
11 Substrate
11*a* Silicon substrate
12 Active Element
12*a* Source area
12*b* Drain area
12*c* Gate insulating film
12*d* Gate electrode
13 First interlayer insulating layer
14, 17, 27, 40, 51 Embedded conductor
15 Circuit line
16 Second interlayer insulating layer
18 Lower line (lower copper line)
19 Third interlayer insulating layer
19*a* Insulating film deposited on third interlayer insulating layer in which memory cell holes are formed
19*b* Fifth interlayer insulating layer (SiN interlayer insulating layer)
20, 20*a*, 202, 203 Memory cell hole
22, 29 Metal electrode layer
23 Variable resistance layer
24 Upper line (first upper line, upper copper line)
24*a* Copper thin film layer
25 Variable resistance element (first variable resistance element)
26 Fourth interlayer insulating layer
30 Intermediate electrode layer
30*a* Metal thin film layer
30*b* Depressed portion
31 Semiconductor layer
31*a* Semiconductor thin film layer
32 Upper electrode
32*a* Metal thin film layer
33 Diode element (first diode element)
41 Interlayer insulating layer
42 Second metal electrode layer
43 Second variable resistance layer
44 Intermediate electrode
45 Second variable resistance element
46 Second semiconductor layer
47 Second upper electrode
48 Second diode element
49 Interlayer insulating layer
50 Second upper line
52 Interlayer insulating layer
53 Third metal electrode layer
54 Third variable resistance layer
55 Third intermediate electrode
56 Third variable resistance element
57 Third semiconductor layer
58 Third upper electrode
59 Third diode element
60 Interlayer insulating layer
61 Third upper line
100, 200, 300, 400, 500 Variable resistance nonvolatile storage device
231 First variable resistance layer
231*a* First resistance thin film layer
232 Second variable resistance layer
232*a* Second resistance thin film layer

The invention claimed is:

1. A manufacturing method for manufacturing a variable resistance nonvolatile storage device, the method comprising:
   (a) forming plural lower lines above a substrate;
   (b) forming an interlayer insulating layer on the plural lower lines and above the substrate;
   (c) forming, in the interlayer insulating layer, plural memory cell holes penetrating to surfaces of the plural lower lines, an opening diameter of upper portions of the plural memory cell holes being smaller than an opening diameter of bottom portions;
   (d) forming a metal electrode layer at least on a bottom of each of the plural memory cell holes by sputtering;
   (e) embedding and forming a variable resistance layer in each of the plural memory cell holes, the variable resistance layer being connected to the metal electrode layer; and
   (f) forming, on the interlayer insulating layer and the variable resistance layer, plural upper lines connected to the variable resistance layer embedded and formed in each of the plural memory cell holes.

2. The manufacturing method according to claim 1, wherein step (c) includes:
   (i) forming, in the interlayer insulating layer, plural memory cell holes penetrating to the surfaces of the plural lower lines, an opening diameter of the upper portions of the plural memory cell holes being greater than or equal to an opening diameter of the bottom portions; and (ii) forming an insulating film on an upper inner wall of each of the plural memory cell holes formed in step (i) in order for the opening diameter of the upper portions of the plural memory cell holes to be smaller than a diameter of the bottoms of the plural memory cell holes.

3. The manufacturing method according to claim 2, wherein in step (ii), at least one selected from a group including $SiO_2$, SiN, $TaO_x$, $NbO_x$, and $SrO_x$ is deposited as the insulating film.

4. The manufacturing method according to claim 1, wherein step (b) includes forming, as the interlayer insulating layer, a lower interlayer insulating layer on the plural lower lines and above the substrate, and an upper interlayer insulating layer on the lower interlayer insulating layer, and step (c) includes:

(i) forming, in the lower interlayer insulating layer and the upper interlayer insulating layer, plural memory cell holes penetrating to the surfaces of the plural lower lines; and (ii) increasing, by wet etching, an opening diameter of portions, of the plural memory cell holes formed in step (i), penetrating the lower interlayer insulating layer relative to an opening diameter of portions, of the plural memory cell holes formed in step (i), penetrating the upper interlayer insulating layer in order for the opening diameter of the portions penetrating the upper interlayer insulating layer to be smaller than the opening diameter of the portions penetrating the lower interlayer insulating layer.

5. The manufacturing method according to claim 1, wherein step (e) includes:

(i) forming a first variable resistance layer on the metal electrode layer; and (ii) forming a second variable resistance layer on the first variable resistance layer, the first variable resistance layer and the second variable resistance layer comprise a same type of metal oxide, and an oxygen content percentage of the first variable resistance layer is higher than an oxygen content percentage of the second variable resistance layer.

6. The manufacturing method according to claim 1, wherein in step (d), the metal electrode layer is formed on the bottom, and on an inner wall portion in vicinity of the bottom of each of the plural memory cell holes.

7. The manufacturing method according to claim 1, wherein the metal electrode layer comprises at least one metal selected from a group including gold (Au), silver (Ag), platinum (Pt), palladium (Pd), iridium (Ir), and ruthenium (Ru).

8. The manufacturing method according to claim 1, further comprising (g) forming, on the variable resistance layer, diode elements each connected to the variable resistance layer, wherein in step (a), the plural lower lines are formed into stripes on the substrate, and in step (f), the plural upper lines are formed into stripes and three-dimensionally cross the plural lower lines, the plural upper lines being connected to upper electrodes of the diode elements.

\* \* \* \* \*